United States Patent [19]
Tsuchida et al.

[11] Patent Number: 6,002,636
[45] Date of Patent: Dec. 14, 1999

[54] SEMICONDUCTOR MEMORY DRIVE CAPABLE OF CANCELING POWER SUPPLY NOISE

[75] Inventors: Kenji Tsuchida, Kawasaki; Shinichiro Shiratake; Tsuneo Inaba, both of Yokohama, all of Japan

[73] Assignee: Kabushiki Kaisha Toshiba, Kawasaki, Japan

[21] Appl. No.: 09/199,463

[22] Filed: Nov. 25, 1998

[30] Foreign Application Priority Data

Nov. 28, 1997 [JP] Japan .................................. 9-329308

[51] Int. Cl.$^6$ .......................................... G11C 8/00
[52] U.S. Cl. .......................... 365/230.06; 365/51; 365/63
[58] Field of Search ............................. 365/230.06, 51, 365/63

[56] References Cited

U.S. PATENT DOCUMENTS

| | | | |
|---|---|---|---|
| 4,044,340 | 8/1997 | Itoh ..................................... | 340/173 R |
| 5,363,326 | 11/1994 | Nakajima ................................ | 365/149 |
| 5,383,160 | 1/1995 | Furuyama ................................ | 365/221 |
| 5,511,027 | 4/1996 | Shimizu .............................. | 365/189.09 |
| 5,740,107 | 4/1998 | Lee ..................................... | 365/185.11 |

*Primary Examiner*—David Nelms
*Assistant Examiner*—Hien Nguyen
*Attorney, Agent, or Firm*—Banner & Witcoff, Ltd.

[57] ABSTRACT

This invention discloses the layout of word line driving circuits for driving word lines. A semiconductor memory device includes a memory cell array having a bit line, $\underline{n}$ memory cells connected to the bit line, and $\underline{n}$ word lines respectively connected to the $\underline{n}$ memory cells. The semiconductor memory device further includes n/2 first word line driving circuits for driving n/2 word lines of the $\underline{n}$ word lines, and n/2 second word line driving circuits for driving the remaining n/2 word lines of the $\underline{n}$ word lines. The second word line driving circuits are arranged at the positions where the second word line driving circuits face the first word line driving circuits via the memory cell array.

27 Claims, 15 Drawing Sheets

SEMICONDUCTOR MEMORY DRIVE CAPABLE OF CANCELING POWER SUPPLY NOISE

BACKGROUND OF THE INVENTION

The present invention relates to a semiconductor integrated circuit device having a dynamic RAM (DRAM) cell and, more particularly, to prevent the data retention characteristics of the memory cells from deteriorating due to capacitive coupling between the word and bit lines.

Of MOS semiconductor memory devices, DRAMs are integrated at the highest density because memory cells forming the DRAM are relatively simple. This trend toward higher integration is due partly to increasing miniaturization. However, as device dimensions shrink, capacitive coupling between signal lines and therefore interference noise between signal lines increase. Reduction in interference noise is one key for realizing a high-density, high-speed DRAM.

The present inventors have found interference noise arising from capacitive coupling between the word and bit lines to be one type of interference noise between signal lines. This will be explained in detail.

FIG. 11 is an equivalent circuit diagram showing the memory cell array of a DRAM. FIG. 11 shows a memory cell array of the folded bit-line scheme. The folded bit-line scheme is the major stream of current DRAMs.

As shown in FIG. 11, in the folded bit-line scheme, memory cells M are arranged not at all the intersections of word lines WL (WL0 to WL7) and bit lines BL (bBL0, BL0, bBL1, BL1, and bBL2) but at half of all the intersections. In general, the contact (to be referred to as a bit line contact hereinafter) of a switching transistor ST of the memory cell M with respect to the bit line BL is shared by adjacent memory cells M.

In the folded bit-line scheme, two types of coupling capacitors, i.e., a coupling capacitor CWB1 at an intersection where a memory cell M is located, and a coupling capacitor CWB2 at an intersection where no memory cell M is located exist as coupling capacitors between the word lines WL and bit lines BL. The capacitances of the coupling capacitors CWB1 and CWB2 are different from each other.

As the design geometries shrink further, and the word line pitch comes closer to the minimum processing size, a self-aligned contact technique is required for the bit line contact. FIG. 12 shows a bit line contact using the self-aligned contact technique.

FIG. 12 is a sectional view showing the memory cell array taken along a bit line. Note that a trench capacitor memory cell is exemplified as the memory cell M.

As shown in FIG. 12, according to the self-aligned technique, the gate electrode (word line WL) of the switching transistor ST of the memory cell M is covered with a silicon nitride (SiN) film 121. A bit line contact 122 is formed in self-alignment with the gate electrode using the silicon nitride film 121 as an insulating film for insulating the gate electrode from the bit line BL. In the self-aligned contact technique, the gate electrode is formed from a conductive film 123 functioning as a word line WL and an insulating (SiO$_2$) film 124 formed on the conductive film 123. The top of the gate electrode is insulated from the bit line BL by the insulating film 124.

Using this self-aligned contact technique eliminates the alignment margin between the bit line contact and gate electrode and contributes to reduction in cell size. However, the word line WL has a relatively high dielectric constant and is insulated from the bit line BL by the thin silicon nitride film 121. This greatly increases the coupling capacitor at the bit line contact 122, i.e., the coupling capacitor CWB1.

At an intersection where no memory cell M is located, the bit line contact need not be formed, and only a thick silicon oxide (SiO$_2$) film 125 exists between the word line WL and bit line BL. Therefore, the capacitance of the coupling capacitor CWB2 is smaller than the capacitance of the coupling capacitor CWB1.

As represented by the self-aligned contact technique, the advance of miniaturization along with an increase in integration degree disturbs balance between the coupling capacitors CWB1 and CWB2 more and more. The unbalance between the coupling capacitors CWB1 and CWB2 generates interference noise on an inactive word line. This will be explained with reference to FIG. 13.

FIG. 13 is a circuit diagram showing the arrangement of a conventional DRAM.

FIG. 13 schematically shows a memory cell array 131 of the folded bit-line scheme including bit lines, memory cells M, and word lines, sense amplifiers S/A for sensing and amplifying a signal from the memory cell M, and word line driving circuits WDRV for activating a specific word line WL (WL0 to WL7) in order to select a memory cell M.

The sense amplifiers S/A are divided into a right sense amplifier group "S/A-RIGHT" and a left sense amplifier group "S/A-LEFT". The groups "S/A-RIGHT" AND "S/A-LEFT" sandwich the memory cell array 131 and extend parallel to the word lines WL.

The word line driving circuits WDRV are divided into an upper word line driving circuit group "WDRV-UPPER" and a lower group "WDRV-LOWER". The groups "WDRV-UPPER" and "WDRV-LOWER" sandwich the memory cell array 131 and extend parallel to the bit lines BL.

Bit lines BL0, bBL0, BL2, and bBL2 are respectively connected to the sense amplifiers S/A belonging to the group "S/A-RIGHT", whereas bit lines BL1, bBL1, BL3, and bBL3 are respectively connected to the sense amplifiers S/A belonging to the group "S/A-LEFT".

Word lines WL0, WL1, WL4, and WL5 are respectively connected to the driving circuits WDRV belonging to the group "WDRV-UPPER", whereas word lines WL2, WL3, WL6, and WL7 are respectively connected to the driving circuits WDRV belonging to the group "WDRV-LOWER".

The sense amplifiers S/A and driving circuits WDRV are divided in order to relax the layout pitch of the circuit.

FIG. 14 is a timing chart showing operation of the DRAM shown in FIG. 13. FIG. 15 is a circuit diagram showing the state of the memory cell array in sensing. FIG. 16 is a circuit diagram showing the state of the memory cell array in precharging.

As shown in FIG. 14, the DRAM is activated when a row address strobe signal bRAS changes from "H" level to "L" level. After the DRAM becomes active, an address is received from outside the DRAM, and a specific word line (word line WL2 in FIG. 14) is activated in accordance with the received address.

Assume that the word line WL2 is activated to "H" level, as shown in FIG. 15. At this time, all the word lines WL0, WL1, and WL3 to WL7 except for the word line WL2 are inactive at the ground potential.

Further, assume that data "1" are read out from all the memory cells M connected to the word line WL2.

In this case, a small potential is read out as memory data of the memory cell M onto the bit lines BL0 to BL3 and slightly increases the potentials of the bit lines BL0 to BL3. Subsequently, the sense amplifiers S/A are activated to sense and amplify the increased potentials. As a result, the bit lines BL0 to BL3 are charged to a high potential (e.g., power supply potential), and the bit lines bBL0 to bBL3 are discharged to a low potential (e.g., ground potential). The inactive word lines WL0, WL1, WL4, and WL5 are capacitively coupled with the bit lines bBL0 to bBL3, the inactive word lines WL3, WL6, and WL7 are capacitively coupled with the bit lines BL0 to BL3, and interference noise is generated on these inactive word lines WL0, WL1, and WL3 to WL7.

If the capacitance of the coupling capacitor CWB1 is equal to the capacitance of the coupling capacitor CWB2, complementary interference noise components are generated on the inactive word lines WL0, WL1, and WL3 to WL7. Apparently, no interference noise is generated on the inactive word lines WL0, WL1, and WL3 to WL7.

However, the capacitance of the coupling capacitor CWB1 is larger than the capacitance of the coupling capacitor CWB2. The inactive word lines WL3, WL6, and WL7 capacitively couple with the bit lines BL0 to BL3 more strongly. The inactive word lines WL0, WL1, WL4, and WL5 capacitively couple with the bit lines bBL0 to bBL3 more strongly.

As shown in FIG. 15, so-called positive interference noise the potential of which rises from the ground potential is generated on the inactive word lines WL3, WL6, and WL7. So-called negative interference noise the potential of which drops from the ground potential is generated on the inactive word lines WL0, WL1, WL4, and WL5.

FIG. 17 is a circuit diagram showing an example of the word line driving circuit WDRV.

As shown in FIG. 17, the driving circuit WDRV comprises a noise killer transistor Q1. The noise killer transistor Q1 applies the ground potential to the corresponding word line when it is inactive. Interference noise generated on the inactive word line is finally absorbed by a ground power supply line VSS via the noise killer transistor Q1.

The resistance of the word line WL is not completely "0". Therefore, if interference noise is generated on an inactive word line, the potential of the inactive word line continuously varies for the time determined by the time constants of this word line and the line path connecting the word line WL to the ground power supply line VSS.

Particularly positive interference noise raises the potential of the inactive word line WL. This increases any leakage current flowing through the source and drain of the switching transistor ST. Consequently, charges (memory data) leak from the memory cell M to degrade the data retention characteristics.

As shown in FIG. 15, positive interference noise is maximized when data "1" are read out from all the cells or when data "0" are read out from all the cells. This is the worst case, but this worst case becomes more prominent in the layout of the word line driving circuits shown in FIGS. 13 and 15.

In the layout shown in FIGS. 13 and 15, the driving circuits WDRV belonging to the group "WDRV-LOWER" drive the word lines WL2, WL3, WL6, and WL7, and the driving circuits WDRV belonging to the group "WDRV-UPPER" drive the word lines WL0, WL1, WL4, and WL5.

The word lines WL2, WL3, WL6, and WL7 are strongly capacitively coupled with the bit lines BL0 to BL3 via the coupling capacitors CWB1, whereas the word lines WL0, WL1, WL4, and WL5 are strongly capacitively coupled with the bit lines bBL0 to bBL3 pairing with the bit lines BL0 to BL3 via the coupling capacitors CWB1.

In this layout, for example, when data "1" are read out from all the cells, as shown in FIG. 15, all negative interference noise is transmitted to the group "WDRV-UPPER", and all positive interference noise is transmitted to the group "WDRV-LOWER".

The ground power supply line VSS is divided into local ground power supply lines "VSS-UPPER" and "VSS-LOWER". The local ground power supply line "VSS-UPPER" is shared by the driving circuits WDRV of the group "WDRV-UPPER", and the local ground power supply line "VSS-LOWER" is shared by the driving circuits WDRV of the group "WDRV-LOWER". These local ground power supply lines "VSS-UPPER" and "VSS-LOWER" respectively have given finite ground power supply line resistances "RVSS". Hence, interference noise generated on an inactive word line generates AC power supply noise on the local ground power supply lines "VSS-UPPER" and "VSS-LOWER" until the interference noise is absorbed by the "trunk" ground power supply line "VSS-LINE".

In the layout shown in FIGS. 13 and 15, all negative or positive interference noise is transmitted to the local ground power supply lines "VSS-UPPER" and "VSS-LOWER". Accordingly, the AC power supply noise is very large.

For example, when all positive interference noise is transmitted to the local ground power supply line "VSS-LOWER", the potential of the local ground power supply line "VSS-LOWER" greatly varies in the positive direction (positive power supply noise), as shown in FIG. 14. While the local ground power supply line "VSS-LOWER" varies, the potentials of the inactive word lines WL3, WL6, and WL7 connected to the local ground power supply line "VSS-LOWER" vary in the positive direction. This considerably degrades the data retention characteristics of the memory cells M.

As shown in FIG. 15, all negative interference noise is transmitted to the local ground power supply line "VSS-UPPER". As a result, as shown in FIG. 14, the potential of the local ground power supply line "VSS-LOWER" greatly varies in the negative direction. Note that negative potential variations do not directly degrade the data retention characteristics.

When the row address strobe signal bRAS changes from "L" level to "H" level to precharge the DRAM, the potential of the bit line BL charged or discharged to the power supply potential or ground potential is equalized to the precharge potential. During precharging, the same interference noise as that in sensing is generated. This is shown in FIG. 16.

As shown in FIG. 16, positive interference noise generated on the word lines WL0, WL1, WL4, and WL5 in precharging generates positive power supply noise on the local ground power supply line "VSS-UPPER". Accordingly, the data retention characteristics of the memory cells M connected to the word lines WL0, WL1, WL4, and WL5 degrade considerably.

As described above, in a very-large-scale DRAM in which fine elements are integrated, either positive interference noise or negative interference noise is generated locally on one inactive word line due to capacitive coupling between the word and bit lines. The local interference noise generates large power supply noise on the ground power supply line until it is completely absorbed by the ground power supply line. Such large power supply noise considerably degrades the data retention characteristics of the memory cell.

BRIEF SUMMARY OF THE INVENTION

The present invention has been made in consideration of the above situation, and has as its main object to provide a semiconductor integrated circuit device capable of suppressing degradation of the data retention characteristics of the memory cells caused by capacitive coupling between the word and bit lines.

To achieve the main object, a semiconductor memory device comprising: a memory cell array, the memory cell array having at least a bit line, $\underline{n}$ memory cells connected to the bit line, and $\underline{n}$ word lines respectively connected to the $\underline{n}$ memory cells; n/2 first word line driving circuits for driving n/2 word lines of the $\underline{n}$ word lines; and n/2 second word line driving circuits for driving remaining n/2 word lines of the $\underline{n}$ word lines, the second word line driving circuits being arranged at positions where the second word line driving circuits face the first word line driving circuits via the memory cell array.

In this aspect, when the potential of a bit line rises, positive interference noise generated on the $\underline{n}$ word lines can be distributed to the first and second word line driving circuits. Accordingly, positive interference noise transmitted to the ground power supply line can be reduced to reduce power supply noise generated on this line. The reduction in power supply noise reduces potential variations generated on an inactive word line. Even if the potential varies, the varying time is short.

Further, to achieve the main object a semiconductor memory device comprising:

a memory cell array, the memory cell array having at least a folded bit-line including at least a first bit line and a second bit line parallel to the first bit line, $\underline{n}$ memory cells connected to the first bit line, $\underline{m}$ memory cells connected to the second bit line, $\underline{n}$ word lines respectively connected to the $\underline{n}$ memory cells, and $\underline{m}$ word lines respectively connected to the $\underline{m}$ memory cells; n/2 first word line driving circuits for driving n/2 word lines of the $\underline{n}$ word lines; n/2 second word line driving circuits for driving remaining n/2 word lines of the $\underline{n}$ word lines, the second word line driving circuits being arranged at positions where the second word line driving circuits face the first word line driving circuits via the memory cell array; m/2 third word line driving circuits for driving m/2 word lines of the $\underline{m}$ word lines; and m/2 fourth word line driving circuits for driving remaining m/2 word lines of the $\underline{m}$ word lines, the fourth word line driving circuits being arranged at positions where the fourth word line driving circuits face the third word line driving circuits via the memory cell array.

In this aspect, similar to the above aspect, when the potential of the first bit line rises, positive interference noise generated on the $\underline{n}$ word lines can be distributed to the first and second word line driving circuits.

In the folded bit-line scheme, when the potential of the first bit line rises, the potential of the second bit line drops. At this time, negative interference noise is generated on the $\underline{m}$ word lines. This negative interference noise is distributed to the third and fourth word line driving circuits.

Accordingly, both positive interference noise and negative interference noise can be transmitted to the ground power supply line to cancel power supply noise generated on the ground power supply line. Canceling the power supply noise reduces potential variations generated on inactive word lines. Even if the potential varies, the varying time is short.

In this manner, according to the present invention, since potential variations generated on inactive word lines can be reduced, degradation of the data retention characteristics of the memory cell can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 1:
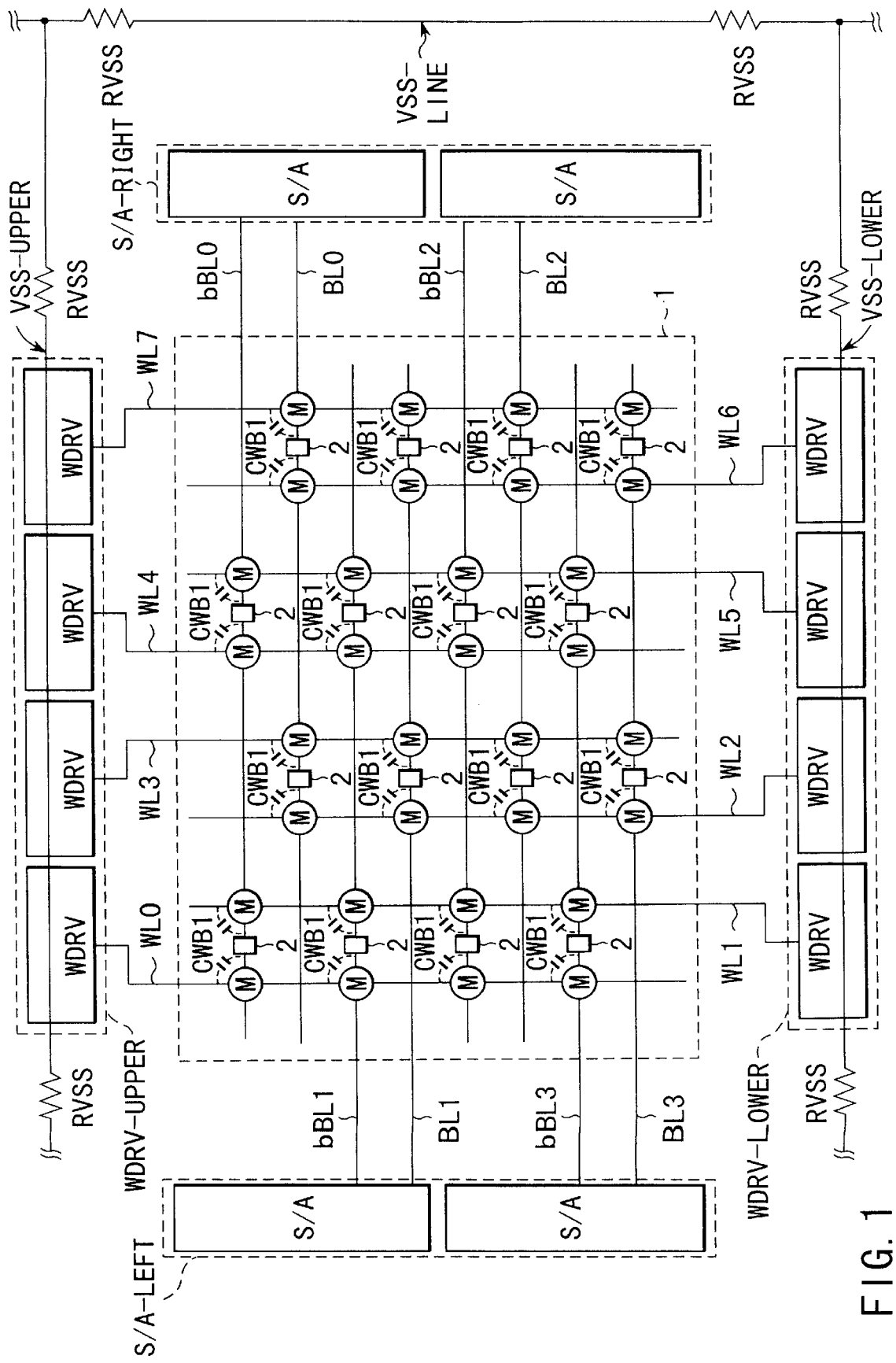
FIG. 1 is a circuit diagram showing the basic arrangement of a DRAM according to the first embodiment of the presen/invention.

FIG. 1 is a circuit diagram showing the basic arrangement of a DRAM according to the first embodiment of the present invention.

As shown in FIG. 1, a memory cell array 1 is of the folded bit-line scheme. The folded bit-line is comprised of bit lines BL (BL0 to BL3) and bit lines bBL (bBL0 to bBL3) pairing with the bit lines BL. The bit lines bBL and BL pair with each other and have complementary potentials in, e.g., sensing. The bit lines bBL are parallel to the bit lines BL within the memory cell array 1.

A plurality of (four in FIG. 1) memory cells M are connected to each bit line BL. Adjacent memory cells M share a contact 2 to the bit line BL. A plurality of (four in FIG. 1) memory cells M are also connected to each bit line bBL. Again, adjacent memory cells M share a contact 2 to the bit line bBL.

The memory cell array 1 of the first embodiment employs a "½-pitch layout". In the ½-pitch layout, the memory cells M shift from each other at a ½ pitch along the word lines WL. (In the memory cell array 1 of the first embodiment, each contact 2 is shared by adjacent memory cells M. This amounts to shifting the contacts 2 from each other at a ½ pitch along the word lines WL.)

The word lines WL cross the bit lines BL and bBL within the memory cell array 1. Of eight word lines WL0 to WL7 shown in FIG. 1, four word lines WL0, WL1, WL4, and WL5 are capacitively coupled with the bit lines BL0 to BL3 via coupling capacitors CWB1. The remaining four word lines WL2, WL3, WL6, and WL7 are capacitively coupled with the bit lines bBL0 to bBL3 via coupling capacitors CWB1. That is, the memory cells M connected to the word lines WL0, WL1, WL4, and WL5 are connected to the bit lines BL. The memory cells M connected to the remaining four word lines WL2, WL3, WL6, and WL7 are connected to the bit lines bBL. That is memory cells M are arranged at half of all the intersections of the word lines WL and bit lines BL and bBL.

Sense amplifiers S/A are divided into a right sense amplifier group "S/A-RIGHT" and a left sense amplifier group "S/A-LEFT". The sense amplifiers S/A belonging to the group "S/A-RIGHT" and the sense amplifiers S/A belonging to "S/A-LEFT" sandwich the memory cell array 1 and extend parallel to the word lines WL. The bit lines BL0, bBL0, BL2, and bBL2 are connected to the group "S/A-RIGHT", whereas the bit lines BL1, bBL1, BL3, and bBL3 are connected to the group "S/A-LEFT".

Figure 13:
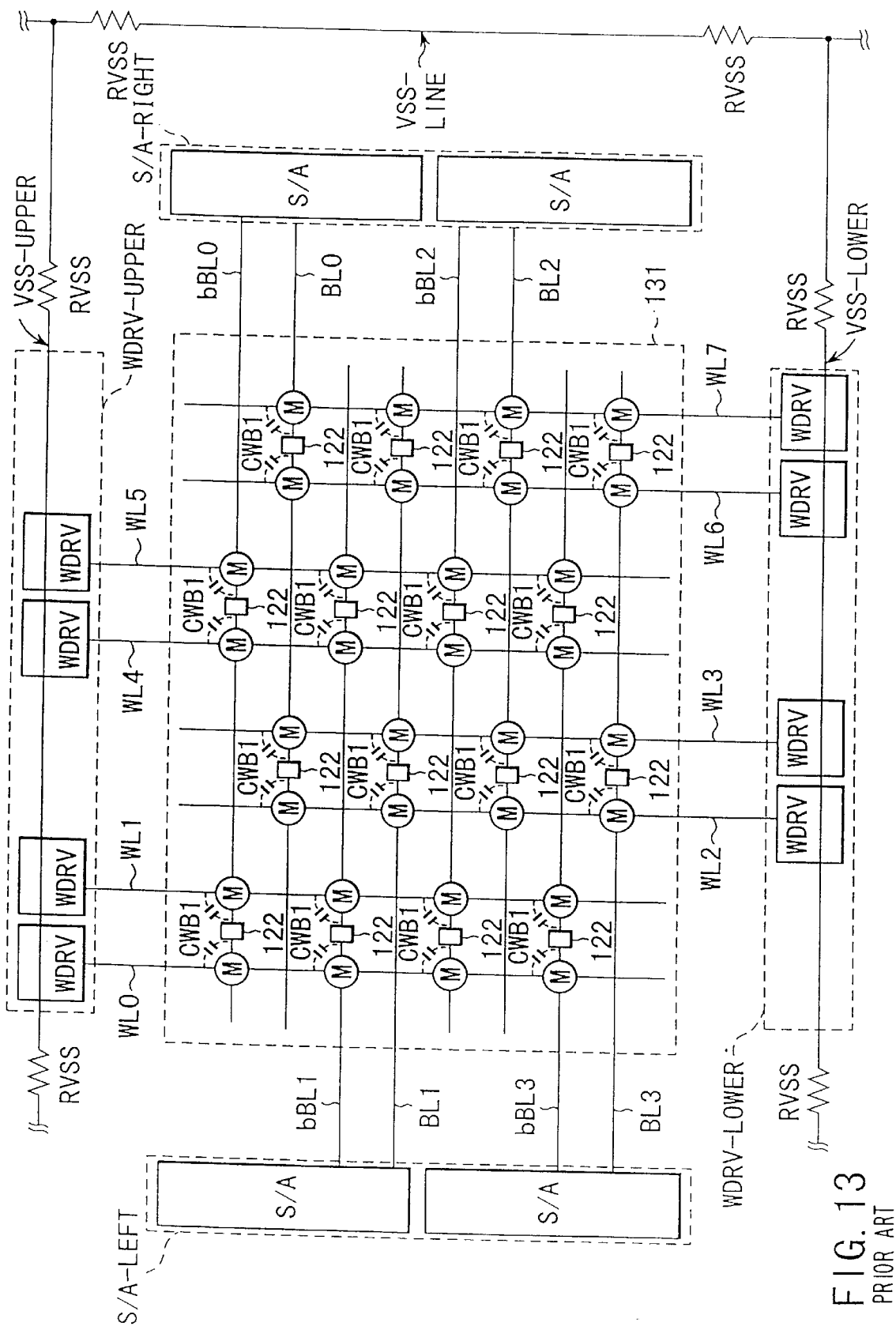
FIG. 13 is a circuit diagram showing the arrangement of a conventional DRAM.
Figure 14:
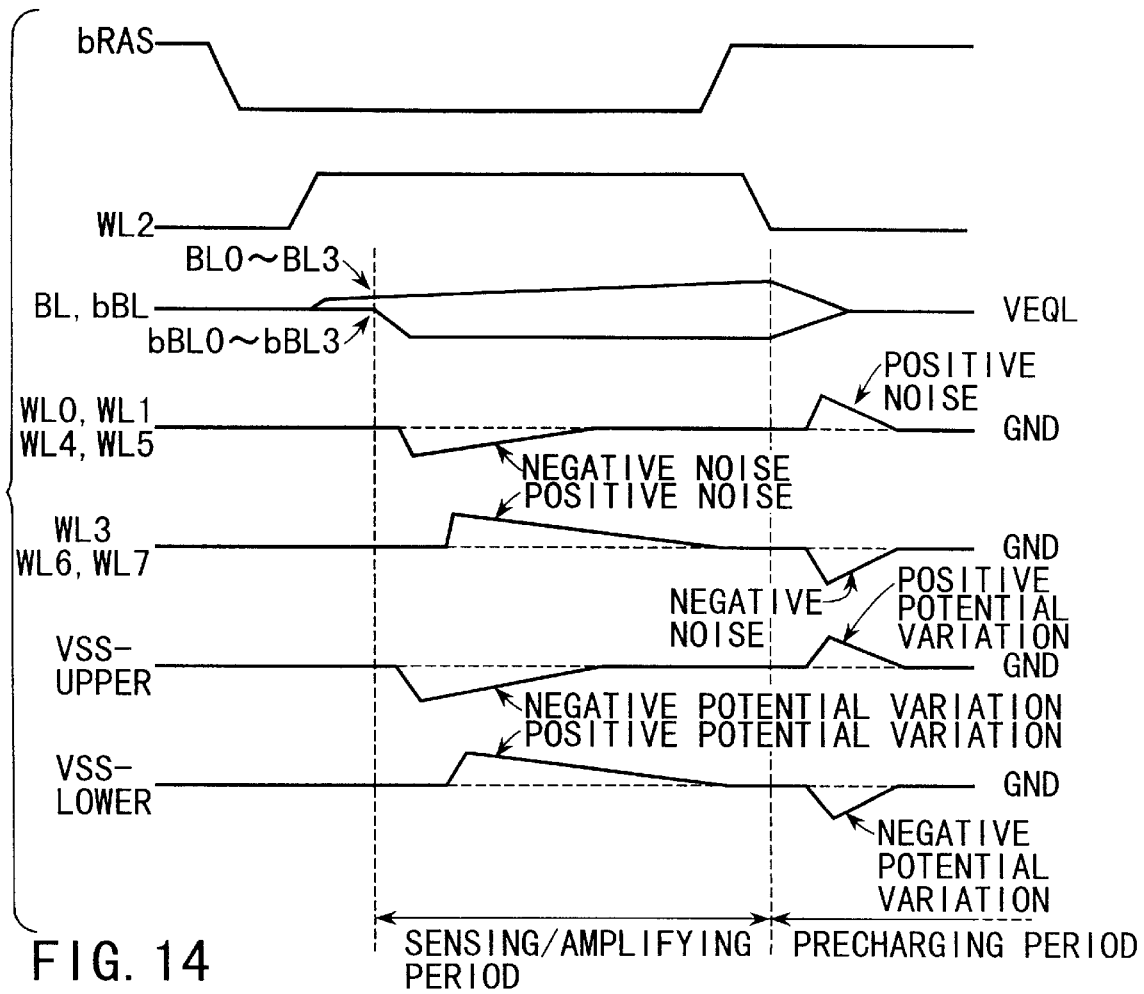
FIG. 14 is an operation timing chart showing operation of the conventional DRAM.

The DRAM according to the first embodiment is different from the conventional DRAM shown in FIG. 13 by the layout of word line driving circuits WDRV.

Figure 17:
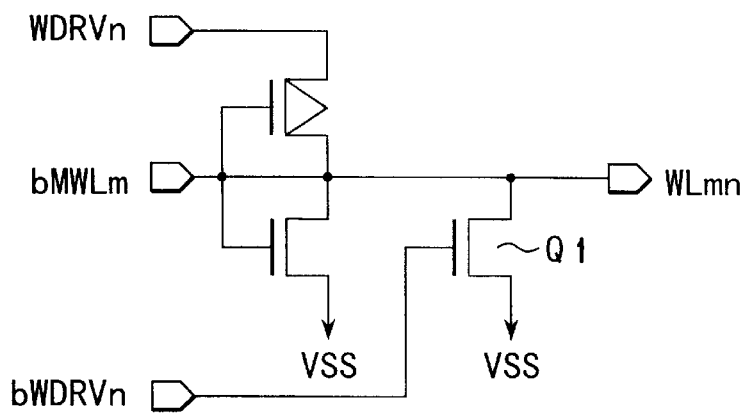
FIG. 17 is a circuit diagram showing an example of a word line driving circuit.
Figure 15:
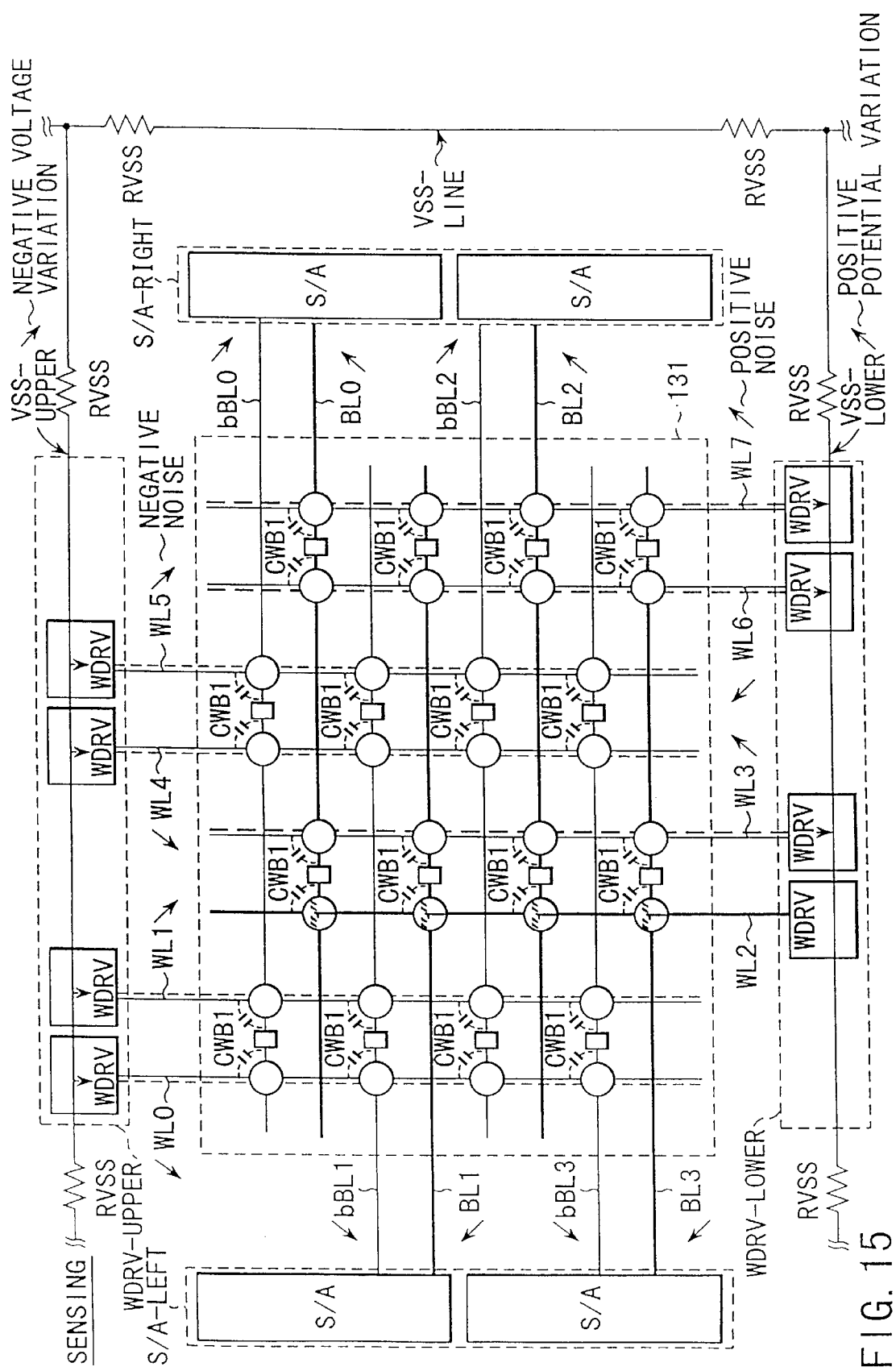
FIG. 15 is a circuit diagram showing the state of the memory cell array in sensing in the conventional DRAM.
Figure 16:
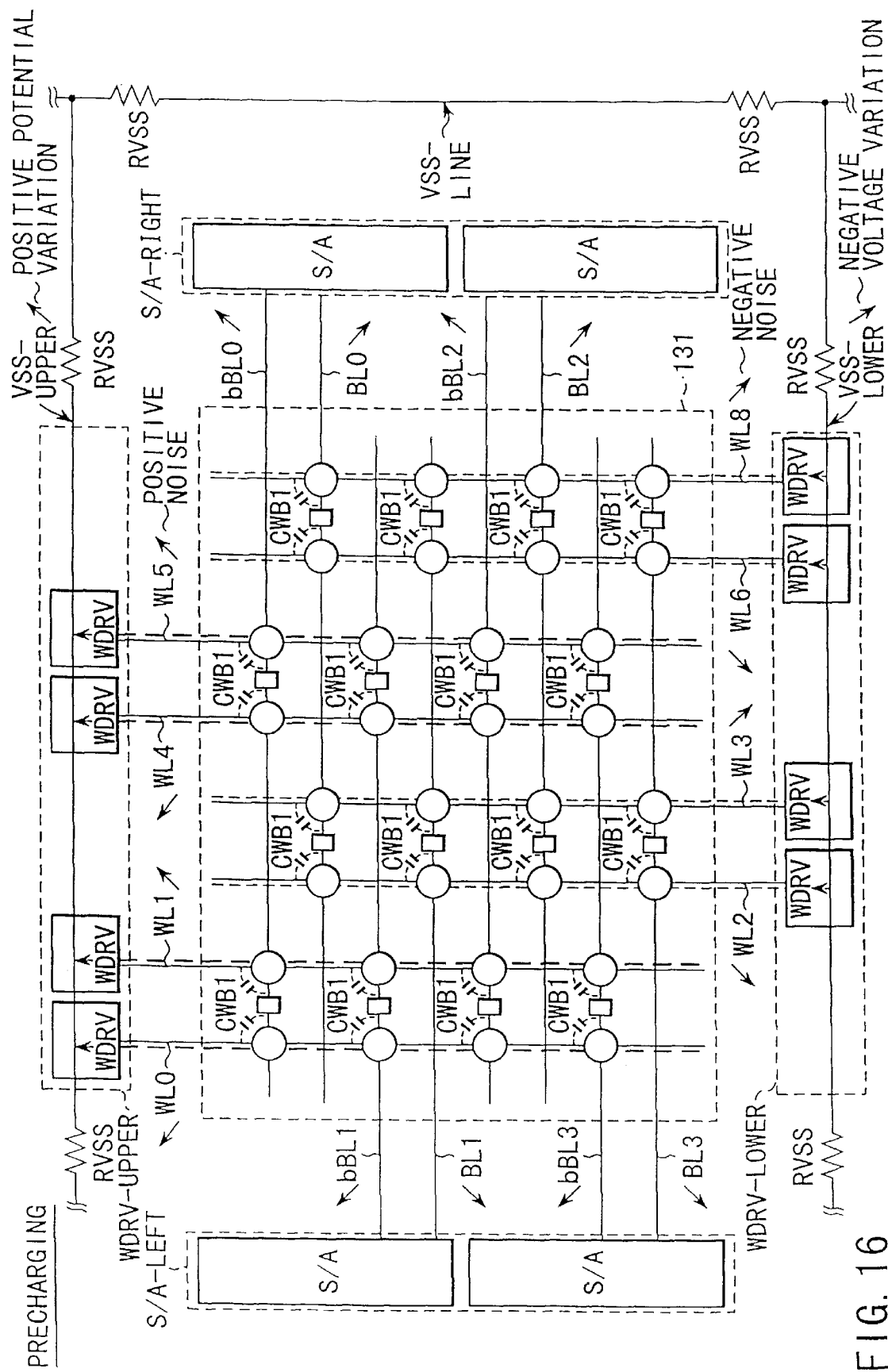
FIG. 16 is a circuit diagram showing the state of the memory cell array in precharging in the conventional DRAM.

More specifically, the driving circuits WDRV are laid out to drive the memory cells M sharing the contacts 2 and the word lines WL (e.g., word lines WL0 and WL1) connected to these memory cells M from two sides of the memory cell array 1. As the driving circuit WDRV, a conventionally known word line driving circuit, e.g., a circuit shown in FIG. 17 can be used.

The arrangement of the first embodiment is compared with the conventional arrangement.

In the conventional arrangement shown in FIG. 13, all the memory cells M connected to one bit line BL, e.g., bit line BL0 and all the word lines WL (WL2, WL3, WL6, and WL7) connected to these memory cells M are connected to the group "WDRV-LOWER".

To the contrary, in the first embodiment, the memory cells N connected to one bit line BL, e.g., bit line BL0 and the word lines WL2, WL3, WL6, and WL7 connected to these memory cells M are halved into two groups. These two groups are respectively connected to the groups "WDRV-UPPER" and "WDRV-LOWER".

In the first embodiment, the word lines WL2, WL3, WL6, and WL7 are divided into the first group consisting of the word lines "WL2 and WL6" and the second group consisting of the word lines "WL3 and WL7". The first group is connected to the group "WDRV-LOWER", whereas the second group is connected to the group "WDRV-UPPER".

The word line driving circuits WDRV belonging to the group "WDRV-UPPER" and the word line driving circuits WDRV belonging to the group "WDRV-LOWER" extend parallel to the bit lines BL while sandwiching the memory cell array 131. The word lines WL0, WL3, WL4, and WL7 are connected to the group "WDRV-UPPER", and the word lines WL1, WL2, WL5, and WL6 are connected to the group "WDRV-LOWER".

The driving circuits WDRV belonging to the group "WDRV-LOWER" are connected to a local ground power supply line "VSS-LOWER". The driving circuits WDRV belonging to the group "WDRV-UPPER" are connected to a local ground power supply line "VSS-UPPER". The local power supply lines "VSS-LOWER" and "VSS-UPPER" are connected to a "trunk" ground power supply line "VSS-LINE".

Note that resistors RVSS shown in FIG. 1 are the line resistances of the ground power supply lines "VSS-LOWER", "VSS-UPPER", and "VSS-LINE". The coupling capacitor CWB1 is the coupling capacitance between each word line WL and bit line BL near a contact 2.

Operation will be explained.

Figure 2:
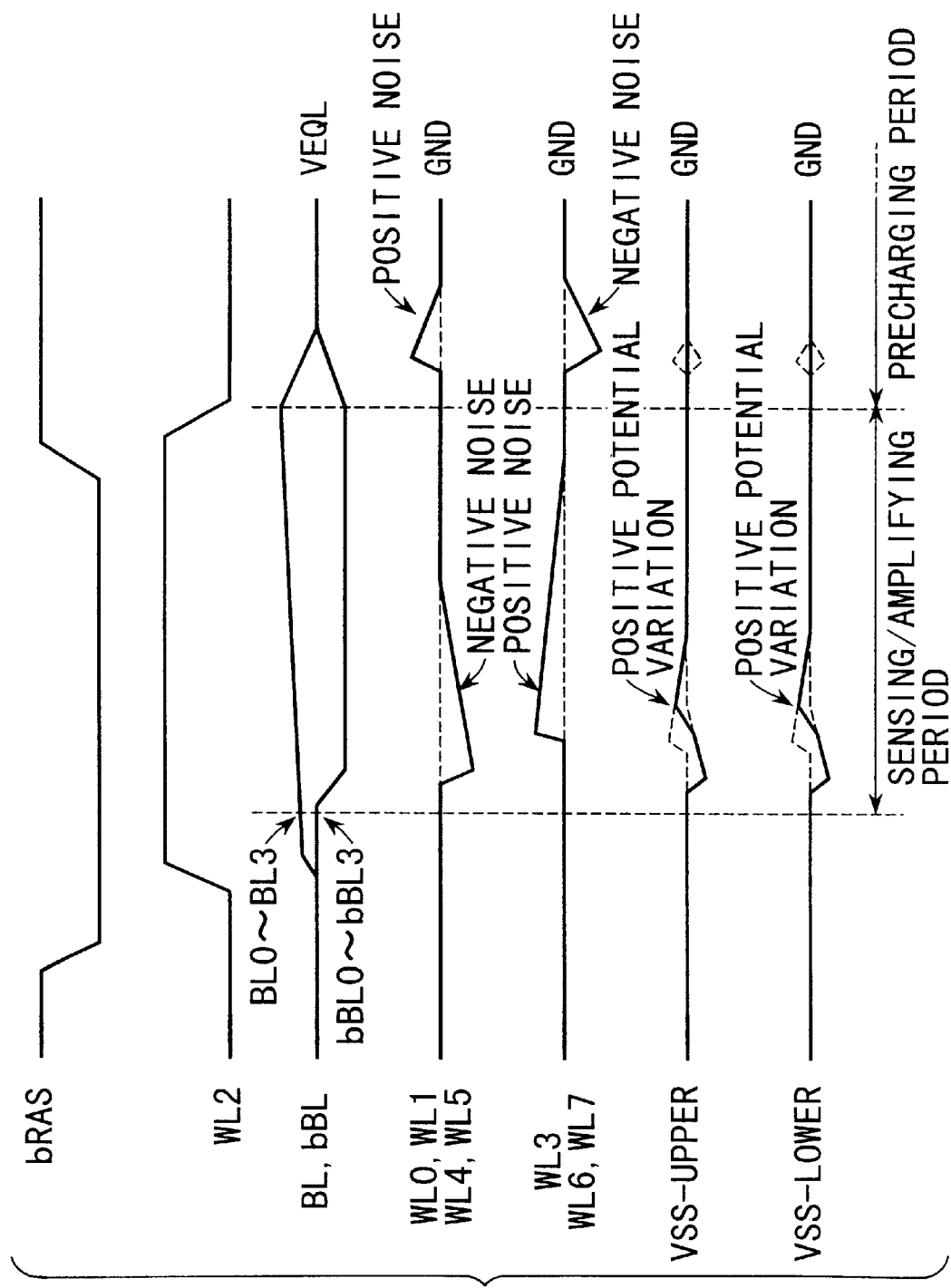
FIG. 2 is an operation timing chart showing the basic operation of the DRAM according to the first embodiment of the present invention.
Figure 3:
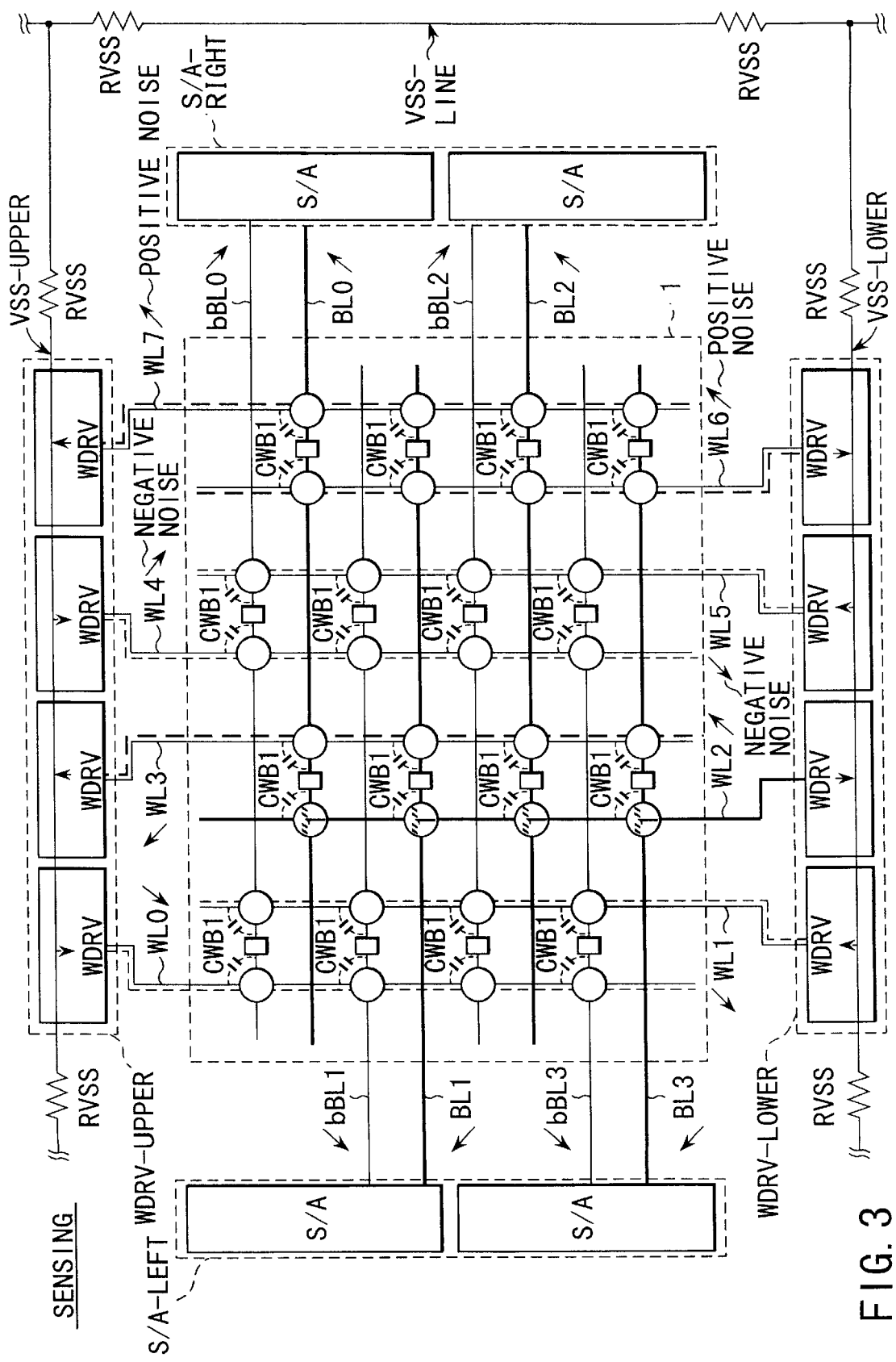
FIG. 3 a circuit diagram showing the state of the memory cell array in sensing in the DRAM according to the first embodiment of the present invention.

FIG. 2 is a timing chart showing the basic operation of the DRAM according to the first embodiment of the present invention. FIG. 3 is a circuit diagram showing the state of the memory cell array in sensing.

As shown in FIG. 2, the DRAM is activated when a row address strobe signal bRAS changes from "H" level to "L" level. After the DRAM becomes active, an address is received from outside the DRAM, and a specific word line (word line WL2 in FIG. 2) is activated in accordance with the received address.

Assume that the word line WL2 is activated to "H" level, as shown in FIG. 3. At this time, all the word lines WL0, WL1, and WL3 to WL7 except for the word line WL2 are inactive. The driving circuits WDRV set the potentials of the inactive word lines to the ground potential.

Further, assume that data "1" are read out from all the memory cells M connected to the word line WL2.

In this case, a small potential is read out as memory data of the memory cell M onto the bit lines BL0 to BL3 and slightly increases the potentials of the bit lines BL0 to BL3 from the precharge potential subsequently, the sense amplifiers S/A are activated to sense and amplify the increased potentials. As a result, the bit lines BL0 to BL3 are charged to a high potential (e.g., power supply potential), and the bit lines bBL0 to bBL3 are discharged to a low potential (e.g., ground potential). The inactive word lines WL0, WL1, WL4, and WL5 are capacitively coupled with the bit lines bBL0 to bBL3, and the inactive word lines WL3, WL6, and WL7 are capacitively coupled with the bit lines BL0 to BL3. Then, negative interference noise is generated on the inactive word lines WL0, WL1, WL4, and WL5, and positive interference noise is generated on the inactive word lines WL3, WL6, and WL7.

The positive interference noise generated on the inactive word lines WL3, WL6, and WL7 flows through the ground power supply line. However, as described above, in the first embodiment, the inactive word lines WL3 and WL7 are connected to the group "WDRV-UPPER", and the inactive word line WL6 is connected to the group "WDRV-LOWER". Therefore, the positive interference noise is distributed almost half and half to the local ground power supply lines "VSS-UPPER" and "VSS-LOWER".

The inactive word lines WL0 and WL4 are connected to the group "WDRV-UPPER", and the inactive word lines WL1 and WL5 are connected to the group "WDRV-LOWER". Similar to the positive interference noise, the negative interference noise generated on the word lines WL0, WL1, WL4, and WL5 is distributed almost half and half to the local ground power supply lines "VSS-UPPER" and "VSS-LOWER".

In the DRAM according to the first embodiment, the positive interference noise and negative interference noise flow into the local ground power supply lines "VSS-UPPER" and "VSS-LOWER" almost half and half. The positive interference noise and negative interference noise generated on inactive word lines can be canceled on the local ground power supply lines "VSS-UPPER" and "VSS-LOWER". Consequently, as shown in FIG. 2, negative power supply noise (negative potential variations) and positive power supply noise (positive potential variations) generated on the local ground power supply lines "VSS-UPPER" and "VSS-LOWER" can be reduced. Particularly the positive power supply noise can be reduced.

Figure 4:
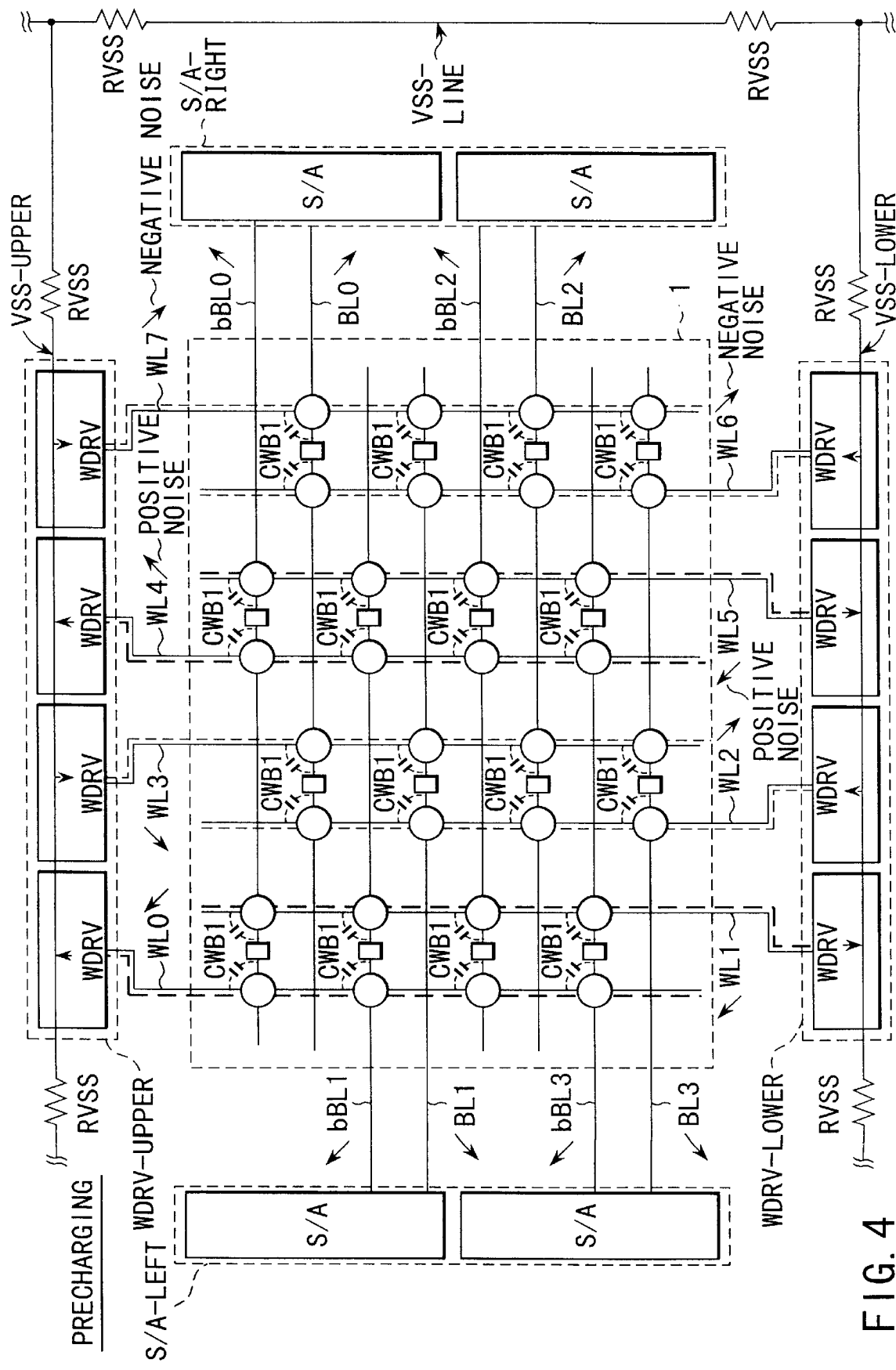
FIG. 4 is a circuit diagram showing the state of the memory cell array in precharging in the DRAM according to the first embodiment of the present invention.

FIG. 4 is a circuit diagram showing the state of the memory cell array in precharging.

As shown in FIG. 4, negative interference noise generated on the inactive word lines WL2, WL3, WL6, and WL7 in precharging (all the word lines are inactive in precharging) flows through the local ground power supply lines "VSS-LOWER" and "VSS-UPPER" almost half and half. Likewise, positive interference noise generated on the inactive word lines WL0, WL1, WL4, and WL5 flows through the local ground power supply lines "VSS-LOWER" and "VSS-UPPER" almost half and half.

As shown in FIG. 2, in precharging similar to sensing, power supply noise generated on the local ground power supply lines "VSS-UPPER" and "VSS-LOWER" can be reduced.

In the DRAM according to the first embodiment, all the word lines WL capacitively coupled with one bit line BL via the coupling capacitors CWB1 are halved, and the halves are respectively connected to the groups "WDRV-UPPER" and "WDRV-LOWER". With this arrangement, positive power supply noise and negative power supply noise generated on the local ground power supply lines "VSS-UPPER" and "VSS-LOWER" can be substantially canceled. Accordingly, potential variations on the local ground power supply lines "VSS-UPPER" and "VSS-LOWER" are reduced. Reduction in potential variations reduces potential variations on the inactive word line. Even if the potential of an inactive word line varies, the varying time is short. Therefore, any leakage current flowing through the source and drain of the switching transistor ST decreases, compared to the conventional arrangement.

According to the DRAM of the first embodiment, any leakage current flowing through the source and drain of the switching transistor ST decreases, compared to the conventional arrangement, thereby suppressing degradation of the data retention characteristics of the memory cells.

Second Embodiment

In the first embodiment, two each of the eight word lines WL0 to WL7 shown in FIG. 1 are alternately connected to the groups "WDRV-UPPER" and "WDRV-LOWER".

The second embodiment is different from the first embodiment in that eight word lines WL0 to WL7 are alternately connected to groups "WDRV-UPPER" and "WDRV-LOWER" one by one.

Figure 5:
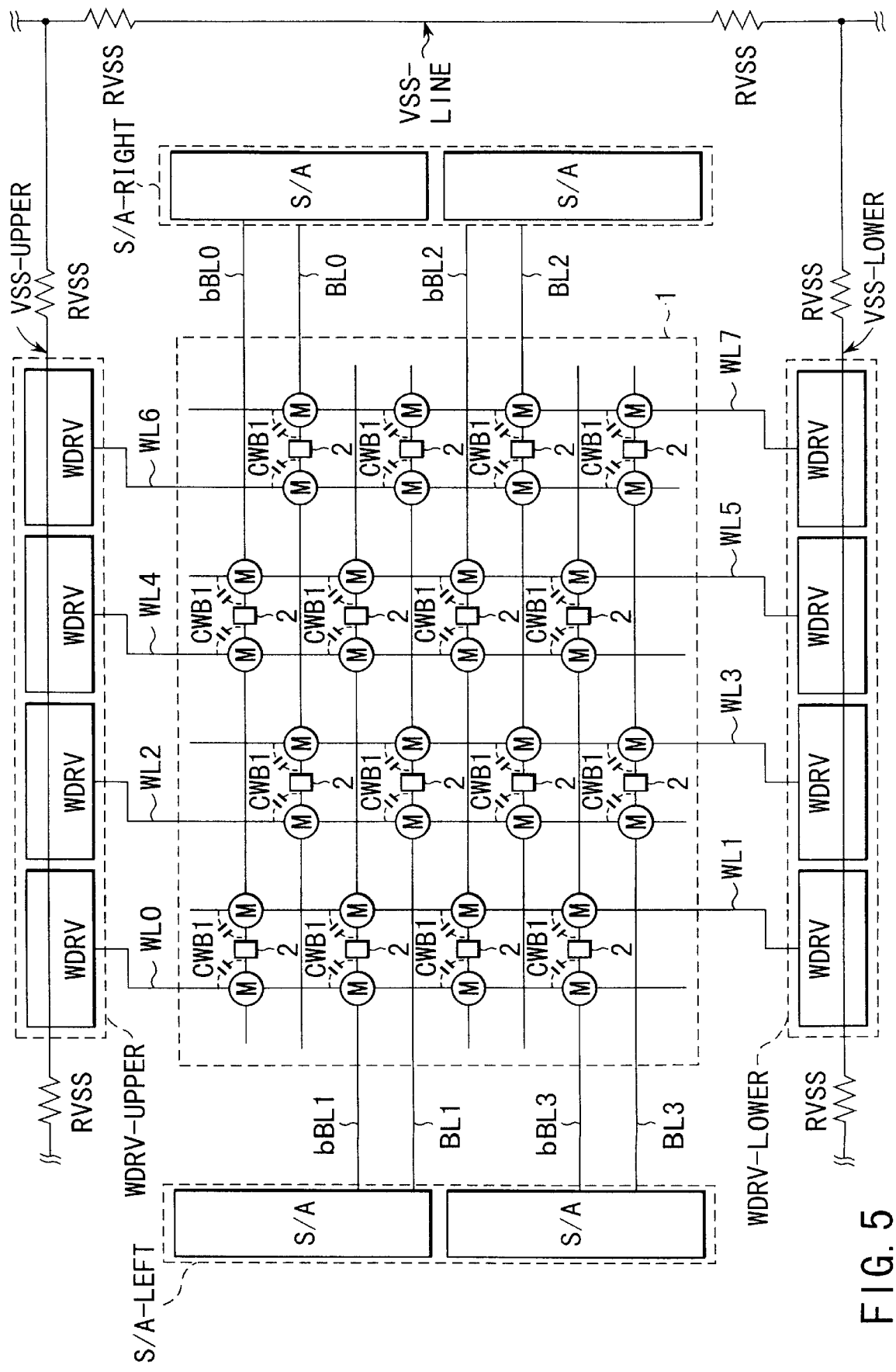
FIG. 5 is a circuit diagram showing the basic arrangement of a DRAM according to the second embodiment of the present invention.

FIG. 5 is a circuit diagram showing the basic arrangement of a DRAM according to the second embodiment of the present invention. In FIG. 5, the same reference numerals as in FIG. 1 denote the same parts, and only a different part will be described.

As shown in FIG. 5, the word lines WL0, WL2, WL4, and WL6 are respectively connected to driving circuits WDRV belonging to the group "WDRV-UPPER", whereas the word lines WL1, WL3, WL5, and WL7 are respectively connected to driving circuits WDRV belonging to the group "WDRV-LOWER".

Also in this case, all the word lines WL capacitively coupled to one bit line BL via coupling capacitors CWB1 can be halved, and the halves can be respectively connected to the groups "WDRV-UPPER" and "WDRV-LOWER".

Positive power supply noise and negative power supply noise generated on local ground power supply lines "VSS-UPPER" and "VSS-LOWER" can be substantially canceled, and the same effects as those of the DRAM according to the first embodiment can be obtained.

Third Embodiment

The third embodiment is different from the first embodiment in that four each of eight word lines WL0 to WL7 are alternately connected to groups "WDRV-UPPER" and "WDRV-LOWER".

Figure 6:
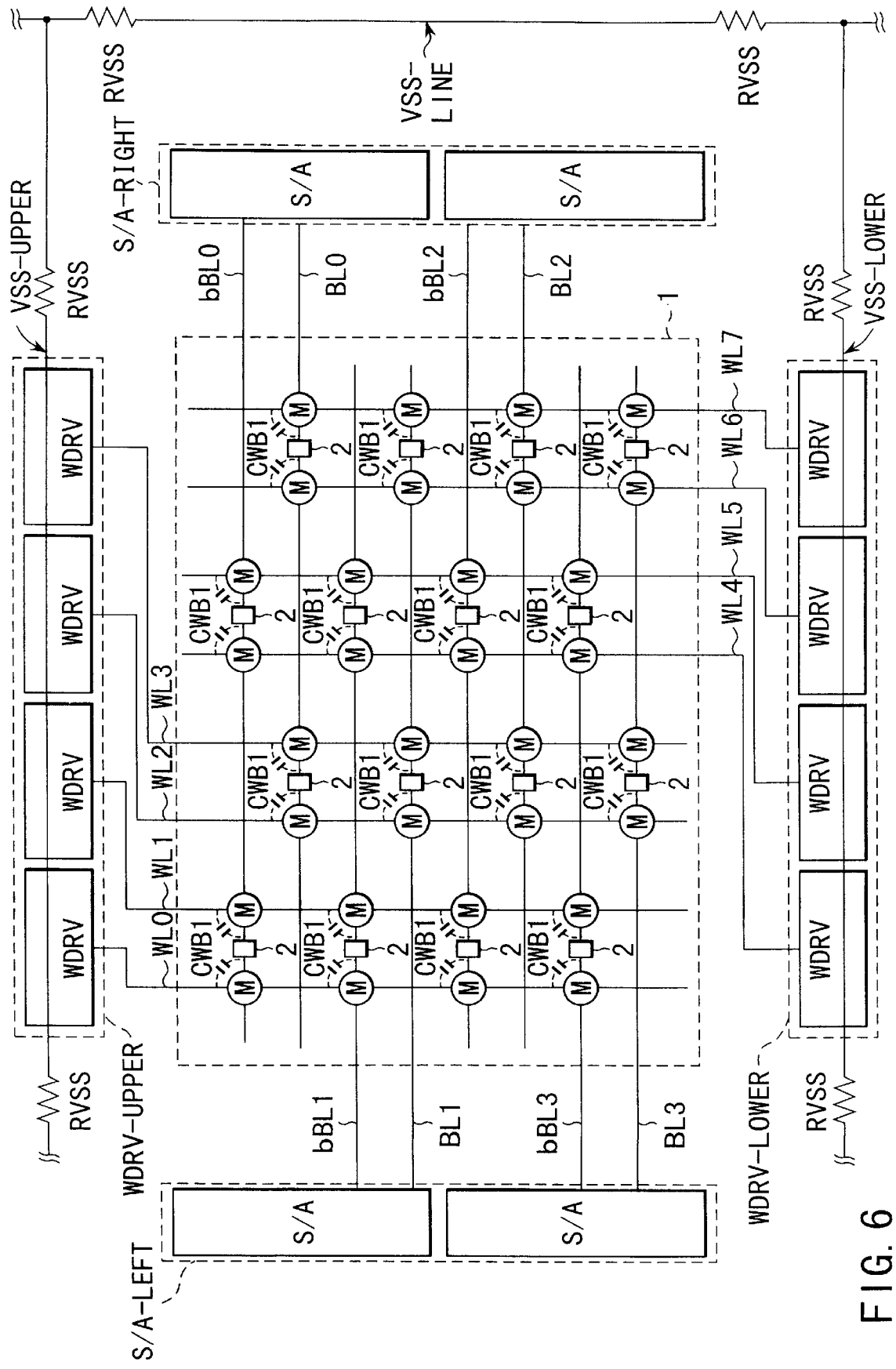
FIG. 6 is a circuit diagram showing the basic arrangement of a DRAM according to the third embodiment of the present invention.

FIG. 6 is a circuit diagram showing the basic arrangement of a DRAM according to the third embodiment of the present invention. In FIG. 6, the same reference numerals as in FIG. 1 denote the same parts, and only a different part will be described.

As shown in FIG. 6, the word lines WL0 to WL3 are respectively connected to driving circuits WDRV belonging to the group "WDRV-UPPER", while the word lines WL4 to WL7 are respectively connected to driving circuits WDRV belonging to the group "WDRV-LOWER".

Also in this case, all the word lines WL capacitively coupled to one bit line BL via coupling capacitors CWB1 can be halved, and the halves can be respectively connected to the groups "WDRV-UPPER" and "WDRV-LOWER".

Positive power supply noise and negative power supply noise generated on local ground power supply lines "VSS-UPPER" and "VSS-LOWER" can be substantially canceled, and the same effects as those of the DRAM according to the first embodiment can be obtained.

If the arrangements of the first and third embodiments are algebraically represented, $n$ word lines are alternately connected to the groups "WDRV-UPPER" and "WDRV-LOWER" in units of $2^k$ lines (k=0, and k is an integer falling within the range $k \geq 1$).

Also when n word lines are connected to the groups "WDRV-UPPER" and "WDRV-LOWER" in units of $2^k$ lines, the same effects as those in the first and third embodiments can be obtained.

Fourth Embodiment

In the first, second, and third embodiments, the memory cells M shift from each other at a pitch of ½ along the word lines WL.

The fourth embodiment is different from the first, second, and third embodiments in that memory cells M shift from each other at a ¼ pitch along word lines WL. (In a memory cell array 1 of the fourth embodiment, a contact 2 is shared by adjacent memory cells M. To put it differently, the contacts 2 shift from each other at a ¼ pitch along the word lines WL.)

Figure 7:
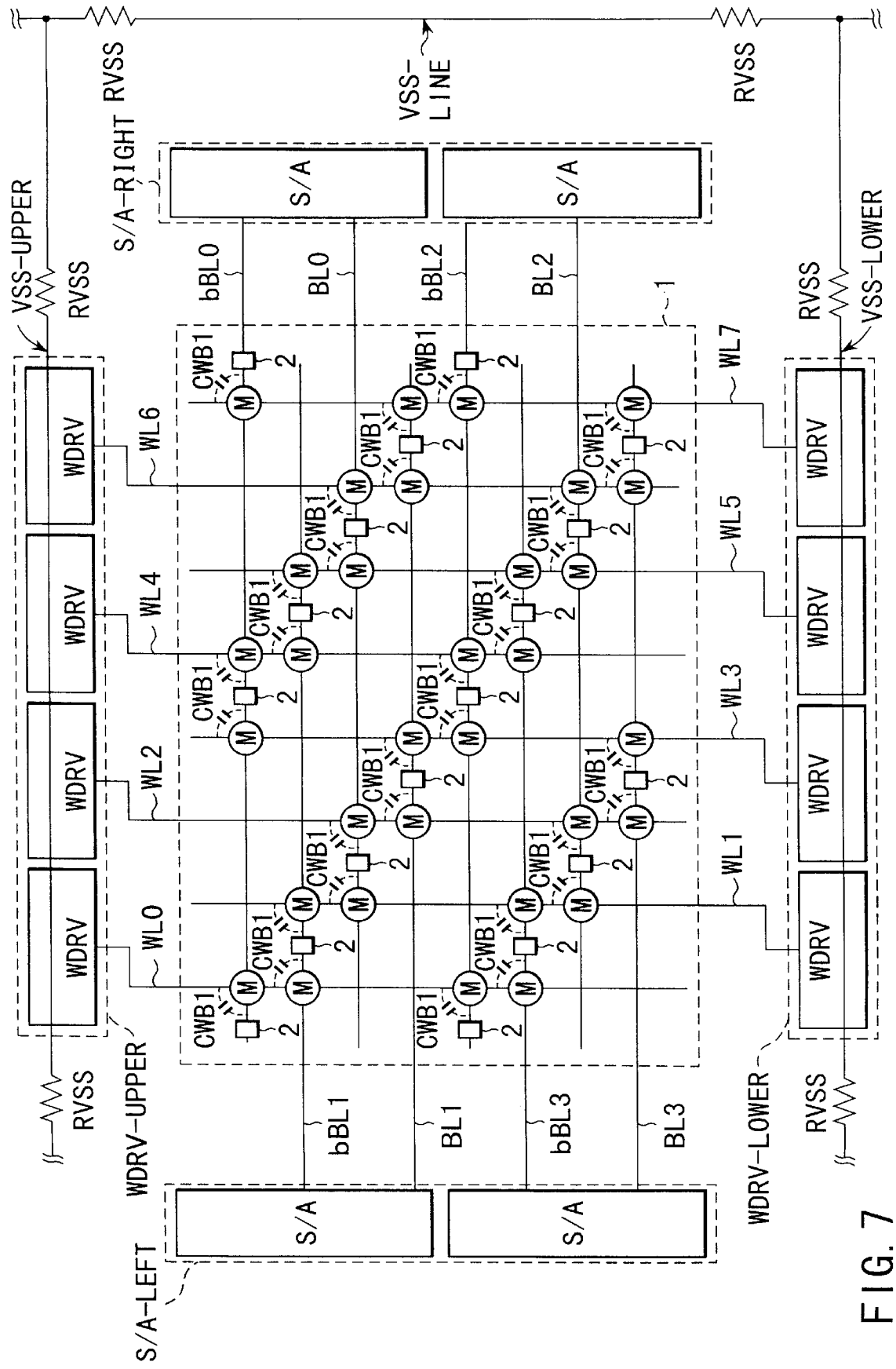
FIG. 7 is a circuit diagram showing the basic arrangement of a DRAM according to the fourth embodiment of the present invention.

FIG. 7 is a circuit diagram showing the basic arrangement of a DRAM according to the fourth embodiment of the present invention. In FIG. 7, the same reference numerals as in FIG. 1 denote the same parts, and only a different part will be described.

As shown in FIG. 7, when the memory cells M shift from each other at a ¼ pitch along the word lines WL, bit lines BL are alternately connected to groups "S/A-RIGHT" and "S/A-LEFT" one by one.

In the fourth embodiment, eight word lines WL0 to WL7 are alternately connected to groups "WDRV-UPPER" and "WDRV-LOWER" one by one. That is, the word lines WL0, WL2, WL4, and WL6 are respectively connected to driving circuits WDRV belonging to the group "WDRV-UPPER", whereas the word lines WL1, WL3, WL5, and WL7 are respectively connected to driving circuits WDRV belonging to the group "WDRV-LEFT".

Also in this case, all the word lines WL capacitively coupled to one bit line BL via coupling capacitors CWB1 can be halved, and the halves can be respectively connected to the groups "WDRV-UPPER" and "WDRV-LOWER".

Positive power supply noise and negative power supply noise generated on local ground power supply lines "VSS-UPPER" and "VSS-LOWER" can be substantially canceled, and the same effects as those of the DRAM according to the first, second, and third embodiments can be obtained.

Fifth Embodiment

In the fifth embodiment, similar to the fourth embodiment, memory cells M shift from each other at a ¼ pitch along word lines WL.

The fifth embodiment is different from the fourth embodiment in that eight word lines WL0 to WL7 are alternately connected to groups "WDRV-UPPER" and "WDRV-LOWER" in units of four lines.

Figure 8:
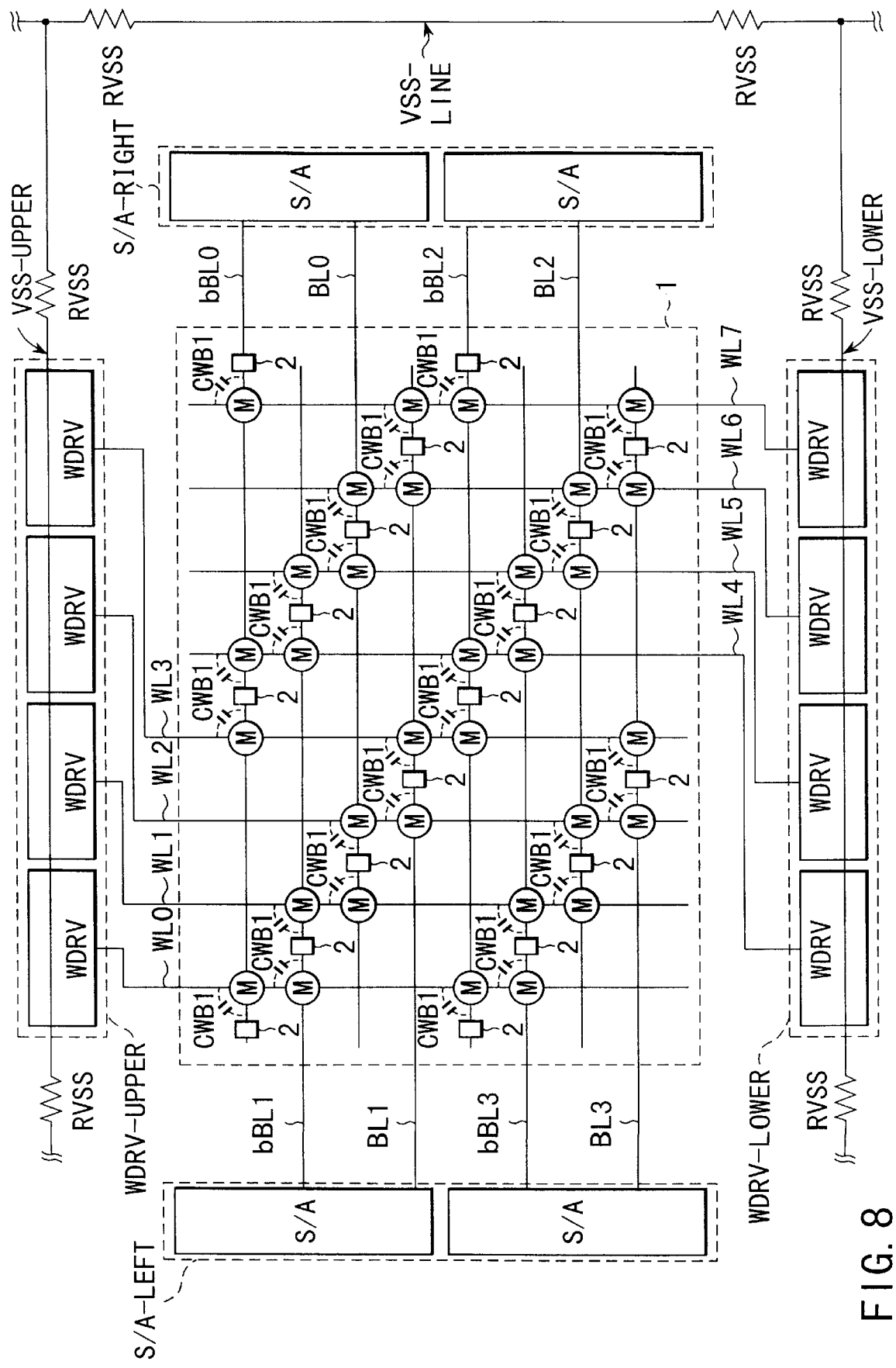
FIG. 8 is a circuit diagram showing the basic arrangement of a DRAM according to the fifth embodiment of the present invention.

FIG. 8 is a circuit diagram showing the basic arrangement of a DRAM according to the fifth embodiment of the present invention. In FIG. 8, the same reference numerals as in FIG. 7 denote the same parts, and only a different part will be described.

As shown in FIG. 8, the word lines WL0 to WL3 are respectively connected to driving circuits WDRV belonging to the group "WDRV-UPPER", while the word lines WL4 to WL7 are respectively connected to driving circuits WDRV belonging to the group "WDRV-LOWER".

Also in this case, all the word lines WL capacitively coupled to one bit line BL via coupling capacitors CWB1 can be halved, and the halves can be respectively connected to the groups "WDRV-UPPER" and "WDRV-LOWER".

Positive power supply noise and negative power supply noise generated on local ground power supply lines "VSS-UPPER" and "VSS-LOWER" can be substantially canceled, and the same effects as those of the DRAM according to the first to fourth embodiments can be obtained.

Note that the fifth embodiment can also be modified as described in the third embodiment such that n word lines are alternately connected to the groups "WDRV-UPPER" and "WDRV-LOWER" in units of $2^k$ lines (k=0, and k is an integer falling within the range k≧1).

Sixth Embodiment

A detailed example of the DRAM according to the present invention in which the present invention becomes particularly effective will be explained as the sixth embodiment with reference to FIGS. 9, 10A, and 10B.

Figure 9:
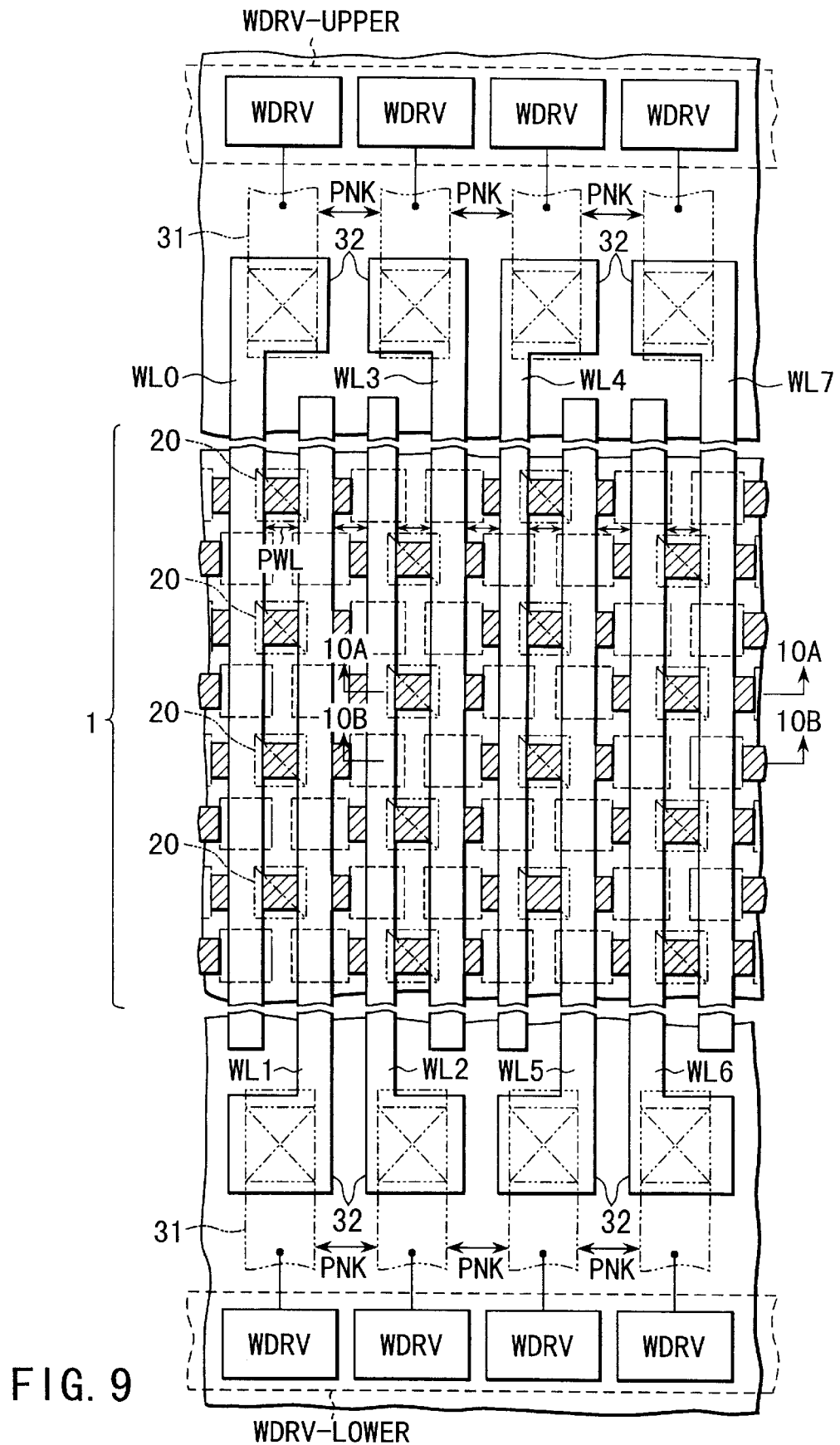
FIG. 9 is a plan view showing the memory cell array of a DRAM according to the sixth embodiment of the present invention.

FIG. 9 is a plan view showing the memory cell array of a DRAM according to the sixth embodiment of the present invention. In FIG. 9, part of the memory cell array is enlarged. FIG. 10A is a sectional view taken along the line 10A—10A in FIG. 9. FIG. 10B is a sectional view taken along the line 10B—10B in FIG. 9.

Figure 10A:
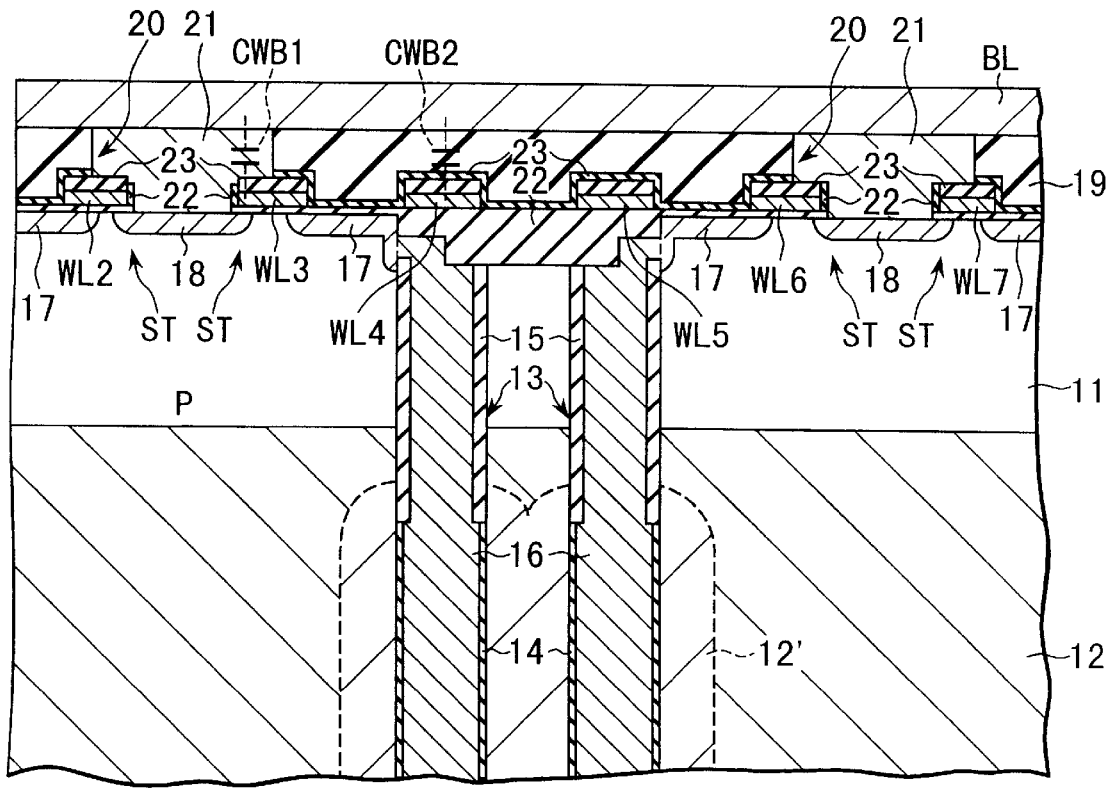
FIG. 10 is a sectional view taken along the line 10A—10A in FIG. 9.
FIG. 10B is a sectional view taken along the line 10B—10B in FIG. 9.
Figure 10B:
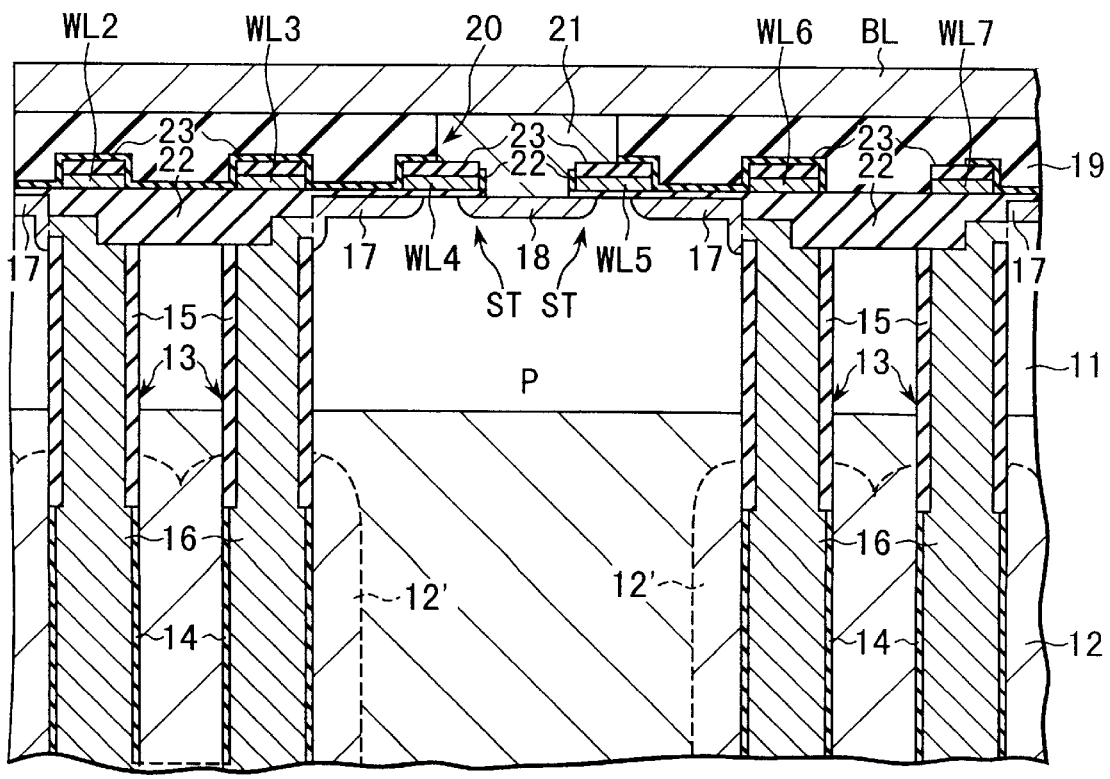
Figure 11:
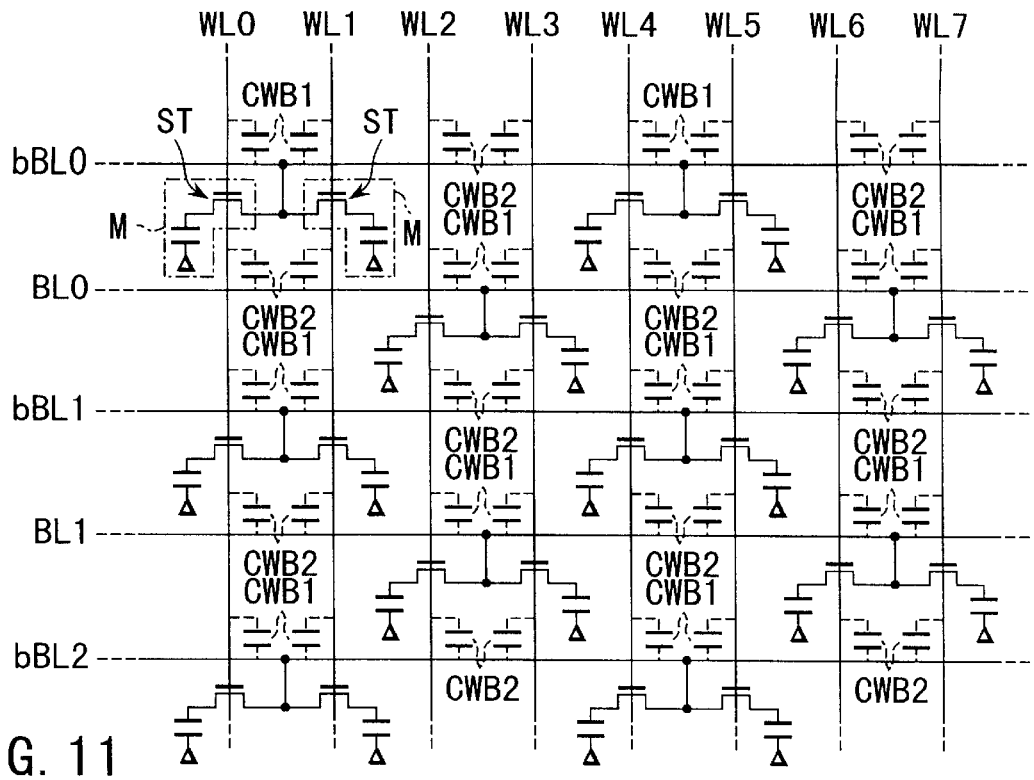
FIG. 11 is an equivalent circuit diagram showing the memory cell array of the DRAM.
Figure 12:
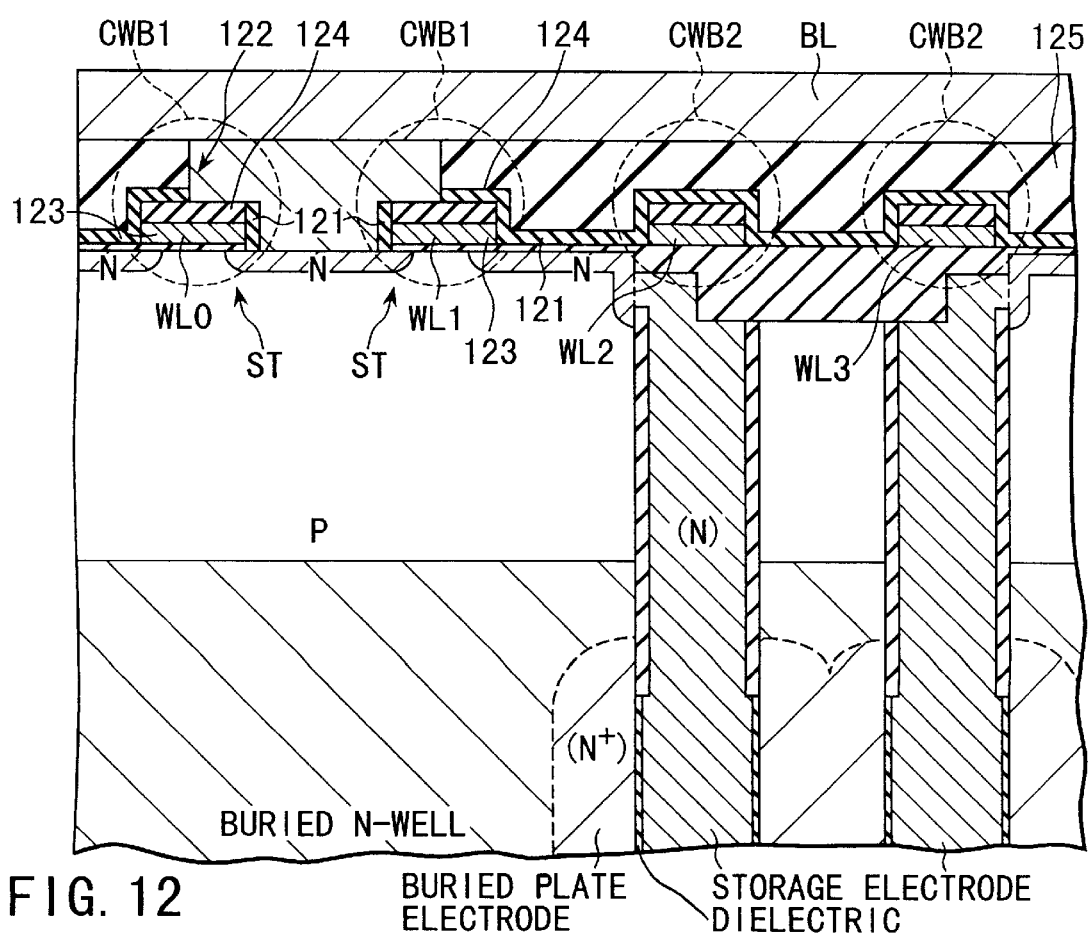
FIG. 12 is a sectional view showing the memory cell array taken along a bit line.

As shown in FIGS. 9, 10A, and 10B, a buried n-well 12 is formed in a p-type silicon substrate 11. In the p-type silicon substrate 11, a capacitor trench 13 is formed to reach the buried n-well 12. A capacitor dielectric film 14 is formed on the sidewall in the capacitor trench 13 in contact with the buried n-well 12, and a thick silicon oxide film 15 is formed on the sidewall in contact with the p-type silicon substrate 11. A buried n⁺-plate electrode 12' is formed at that portion of the buried n-well 12 which is in contact with the dielectric film 14. A storage electrode 16 capacitively coupled to the plate electrode 12' via the dielectric film 14 is formed inside the trench 13 to form a trench capacitor. The storage electrode 16 is electrically connected to an n-type drain region 17 of a switching transistor ST. An n-type source region 18 of the transistor ST is connected to a bit line BL. The n-type source region 18 is shared by adjacent transistors.

The n-type source region 18 of the transistor ST and the bit line BL are connected by a self-aligned contact technique. An interlevel insulating film 19 is made of silicon oxide. A bit line contact hole 20 (corresponding to the contact 2 in FIG. 1) formed in the interlevel insulating film 19 has a hole diameter larger than a pitch PWL between the gate electrodes of the transistors ST, i.e., word lines WL. The pitch PWL between the word lines WL is, e.g., 0.25 μm or less. The contact hole 20 is filled with a conductor 21. The bit line BL is connected to the conductor 21 filled in the bit line contact hole 20 and to the n-type source region 18.

In FIGS. 10A and 10B, reference numeral 22 denotes an insulating film such as a silicon nitride film which covers the word line WL to insulate the conductor 21 from the sidewall of the word line WL. Reference numeral 23 denotes an insulating film such as a silicon oxide film or silicon nitride film which insulates the conductor 21 from the upper surface of the word line WL.

In the sixth embodiment, the bit line BL is connected to the n-type source region 18 of the transistor ST, i.e., a memory cell M by the self-aligned contact technique. For this reason, a coupling capacitor CWB1 between the bit line BL and word line WL in the contact hole 20 is much larger than a coupling capacitor CWB2 at the portion where the bit line BL and word line WL only cross each other. Since the self-aligned contact technique is employed, the difference between the coupling capacitors CWB1 and CWB2 may considerably increase with increasing miniturization. Accordingly, interference noise caused by the coupling capacitor CWB1 may pose a serious problem.

The effects of the present invention can be obtained by different coupling capacitors CWB1 and CWB2. However, as shown in FIGS. 9, 10A, and 10B, the effects of the present invention can be realized particularly well by a device with the contact hole 20 using the self-aligned contact technique because the contact hole 20 using the self-aligned contact technique can greatly increase the coupling capacitor CWB1.

In the sixth embodiment, as shown in FIG. 9, the word lines WL are formed at substantially an equal pitch PWL, and two each word lines WL are respectively extracted to the two ends of the memory cell array 1. The word lines WL are connected to driving circuits WDRV, particularly noise killer transistors (transistor Q1 shown in FIG. 17), via interconnections 31. The interconnections 31 are also formed at substantially an equal pitch PNK, similar to the word lines WL. The pitch PNK of the interconnections 31 is larger than the pitch PWL of the word lines WL. For example, the pitch PNK is twice or less larger than the pitch PWL.

Each contact 32 which is formed on a word line WL and connected to an interconnection 31 juts out toward an adjacent word line WL which shares the contact hole 20. This layout allows to form the contact 32 of the word line WL0 and the contact 32 of the word line WL1 within the region having a width corresponding to the two word lines WL0 and WL1.

One word line driving circuit WDRV is mounted in the region having a width corresponding to two word lines WL. This layout attains the following advantages.

In the conventional layout, one word line driving circuit WDRV is located in the region having a width smaller than a width corresponding to two word lines WL. On the semiconductor chip, a space where no driving circuit WDRV is arranged, i.e., dead space exists in each of the region on the semiconductor chip where the group "WDRV-UPPER" is located and the region where the group "WDRV-LOWER" is located.

To the contrary, in the present invention, as particularly shown in FIG. 9, one word line driving circuit WDRV is arranged in the region having a width corresponding to two word lines WL. The driving circuits WDRV are mounted at a higher density in the region where the group "WDRV-UPPER" is located and the region where the group "WDRV-LOWER" is located. Therefore, the dead space can be reduced compared to the conventional layout.

According to the sixth embodiment, since the dead space can be reduced, a larger number of circuit elements can be mounted on the semiconductor chip, thereby obtaining a DRAM having a higher integration degree.

In the sixth embodiment, each contact 32 for connecting a word line WL to an interconnection 31 juts out toward an adjacent word line WL which shares the contact hole 20. This arrangement allows to form the contact 32 within the region corresponding to two word lines WL.

In the sixth embodiment, the pitches PNK between the interconnections 31 are made equal. This arrangement allows to form at an equal pitch the patterns of the interconnections 31 drawn on a mask used in lithography. If patterns drawn on the mask are formed at an equal pitch, "thinning" of the interconnections 31 due to diffraction of light generated in lithography can be suppressed. Therefore, in the arrangement in which the pitches PNK between the interconnections 31 are made equal, the patterns of the interconnections 31 can be easily faithfully reproduced on a wafer (semiconductor chip), and the interconnections 31 can be easily micropatterned.

In the sixth embodiment, the word lines WL are also formed at the equal pitch PWL, and two each word lines WL are respectively extracted to the two ends of the memory cell array 1. In this arrangement, similar to the interconnection 31, "thinning" of the word lines WL can be suppressed at the two ends of the memory cell array 1, and the word lines WL can be micropatterned.

In the DRAM according to the first to sixth embodiments, both positive interference noise and negative interference noise can be transmitted to the ground power supply line. Even if the balance between coupling capacitors at the intersections of the word and bit lines is lost, power supply noise generated on the ground power supply line can be canceled. That is, AC potential variations generated on the ground power supply line can be minimized.

Since AC potential variations generated on the ground power supply line are suppressed, potential variations generated on inactive word lines can be reduced to suppress degradation of the data retention characteristics of the memory cells.

As a result of suppressing degradation of the data retention characteristics, a DRAM excellent in data retention characteristics can be obtained. The DRAM excellent in data retention characteristics is effective for realizing a high-density, high-speed DRAM.

Because of excellent data retention characteristics, e.g., the self-refresh period can be prolonged compared to the conventional period. A long self-refresh period can decrease current consumption in a self-refresh and realize a low-power-consumption DRAM.

The present invention is not limited to the first to sixth embodiments, and can be variously modified within the spirit and scope of the present invention.

For example, the sixth embodiment has exemplified a DRAM on which trench capacitor memory cells are integrated, but can be applied to a DRAM on which stacked capacitor memory cells are integrated.

The first to sixth embodiments have exemplified a DRAM. However, the present invention is applicable to a semiconductor memory device other than the DRAM as far as the device has a memory cell array (e.g., memory cell array of the folded bit-line scheme) on which memory cells are not formed at all the intersections of the bit and word lines.

For example, the present invention can be applied to a FRAM adopting a dynamic differential amplifier as a bit line sense amplifier for sensing and amplifying information from the memory cell, SRAM, or PROM.

As has been described above, according to the present invention, a semiconductor integrated circuit device capable of suppressing degradation of the data retention characteristics of the memory cells owing to capacitive coupling between the word and bit lines can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:
   a memory cell array, said memory cell array having at least
   a bit line,
   n memory cells connected to said bit line, and
   n word lines respectively connected to said n memory cells;
   n/2 first word line driving circuits for driving n/2 word lines of said n word lines; and
   n/2 second word line driving circuits for driving remaining n/2 word lines of said n word lines, said second word line driving circuits being arranged at positions where said second word line driving circuits face said first word line driving circuits via said memory cell array.

2. A semiconductor memory device according to claim 1, wherein said n word lines are alternately connected to said first and second word line driving circuits in units of $2^k$ (k is an integer falling within the range $k \geq 1$).

3. A semiconductor memory device according to claim 1, wherein said n word lines are alternately connected to said first and second word line driving circuits one by one.

4. A semiconductor memory device according to claim 1, wherein each of said first and second word line driving circuits has a width corresponding to two word lines.

5. A semiconductor memory device according to claim 1, wherein said memory cells are connected to said bit line using self-aligned contacts.

6. A semiconductor memory device comprising:
   a memory cell array, said memory cell array having at least
   a folded bit-line including at least a first bit line and a second bit line parallel to said first bit line,
   n memory cells connected to said first bit line,
   m memory cells connected to said second bit line,
   n word lines respectively connected to said n memory cells, and
   m word lines respectively connected to said m memory cells;
   n/2 first word line driving circuits for driving n/2 word lines of said n word lines;
   n/2 second word line driving circuits for driving remaining n/2 word lines of said n word lines, said second word line driving circuits being arranged at positions where said second word line driving circuits face said first word line driving circuits via said memory cell array;
   m/2 third word line driving circuits for driving m/2 word lines of said m word lines; and
   m/2 fourth word line driving circuits for driving remaining m/2 word lines of said m word lines, said fourth word line driving circuits being arranged at positions where said fourth word line driving circuits face said third word line driving circuits via said memory cell array.

7. A semiconductor memory device according to claim 6, wherein the (n+m) word lines are alternately connected to a group including said first and third word line driving circuits and a group including said second and fourth word line driving circuits in units of $2^k$ (k is an integer falling within the range $k \geq 1$).

8. A semiconductor memory device according to claim 6, wherein said n word lines are alternately connected to said first and second word line driving circuits one by one, and said m word lines are alternately connected to said third and fourth word line driving circuits one by one.

9. A semiconductor memory device according to claim 6, wherein each of said first, second, third, and fourth word line driving circuits has a width corresponding to two word lines.

10. A semiconductor memory device according to claim 6, wherein said memory cells are connected to said first and second bit lines using self-aligned contacts.

11. A semiconductor memory device comprising:
    a memory cell array, said memory cell array having at least
    a bit line,
    first and second memory cells connected to said bit line, said first and second memory cells sharing a contact to said bit line,
    a first word line connected to said first memory cell, and
    a second word line connected to said second memory cell;
    a first word line driving circuit for driving said first word line; and
    a second word line driving circuit for driving said second word line, said second word line driving circuit being arranged at a position where said second word line driving circuit faces said first word line driving circuit via said memory cell array.

12. A semiconductor memory device according to claim 11, wherein each of said first and second word line driving circuits has a width corresponding to two word lines.

13. A semiconductor memory device according to claim 11, wherein the contact is a self-aligned contact.

14. A semiconductor memory device according to claim 11, wherein said first word line driving circuit includes at least a first transistor for grounding said first word line when said first word line is inactive, and
    said second word line driving circuit includes at least a second transistor for grounding said second word line when said second word line is inactive.

15. A semiconductor memory device according to claim 14, further comprising:
    a first ground line for supplying a ground potential to said first transistor; and
    a second ground line for supplying the ground potential to said second transistor, said second ground line being arranged at a position where said second ground line faces said first ground line via said memory cell array.

16. A semiconductor memory device comprising:
    a memory cell array, said memory cell array having at least
    a folded bit-line including a first bit line and a second bit line parallel to said first bit line,
    first and second memory cells connected to said first bit line, said first and second memory cells sharing a contact to said first bit line,
    third and fourth memory cells connected to said second bit line, said third and fourth memory cells sharing a contact to said second bit line,
    a first word line connected to said first memory cell,
    a second word line connected to said second memory cell,
    a third word line connected to said third memory cell, and
    a fourth word line connected to said fourth memory cell;
    a first word line driving circuit for driving said first word line;
    a second word line driving circuit for driving said second word line, said second word line driving circuit being arranged at a position where said second word line driving circuit faces said first word line driving circuit via said memory cell array;

a third word line driving circuit for driving said third word line; and a fourth word line driving circuit for driving said fourth word line, said fourth word line driving circuit being arranged at a position where said fourth word line driving circuit faces said third word line driving circuit via said memory cell array.

17. A semiconductor memory device according to claim 16, wherein said third word line driving circuit is adjacent to said first word line driving circuit.

18. A semiconductor memory device according to claim 17, wherein said third word line is adjacent to said second word line.

19. A semiconductor memory device according to claim 16, wherein each of said first, second, third, and fourth word line driving circuits has a width corresponding to two word lines.

20. A semiconductor memory device according to claim 16, wherein each contact is a self-aligned contact.

21. A semiconductor memory device according to claim 16, wherein said first word line driving circuit includes at least a first transistor for grounding said first word line when said first word line is inactive, said second word line driving circuit includes at least a second transistor for grounding said second word line when said second word line is inactive, said third word line driving circuit includes at least a third transistor for grounding said first word line when said third word line is inactive, and said fourth word line driving circuit includes at least a fourth transistor for grounding said second word line when said fourth word line is inactive.

22. A semiconductor memory device according to claim 21, further comprising:

a first ground line for supplying a ground potential to said first and third transistors; and a second ground line for supplying the ground potential to said second and fourth transistors, said second ground line being arranged at a position where said second ground line faces said first ground line via said memory cell array.

23. A semiconductor memory device comprising:

a memory cell array, said memory cell array having at least a folded bit-line including a first bit line and a second bit line parallel to said first bit line, first and second memory cells connected to said first bit line, said first and second memory cells sharing a contact to said first bit line, third and fourth memory cells connected to said second bit line, said third and fourth memory cells sharing a contact to said second bit line, a first word line connected to said first memory cell, a second word line connected to said second memory cell, a third word line connected to said third memory cell, and a fourth word line connected to said fourth memory cell;

a first word line driving circuit for driving said first word line;

a second word line driving circuit for driving said second word line, said second word line driving circuit being adjacent to said first word line driving circuit;

a third word line driving circuit for driving said third word line, said third word line driving circuit being arranged at a position where said third word line driving circuit faces said first and second word line driving circuits via said memory cell array; and a fourth word line driving circuit for driving said fourth word line, said fourth word line driving circuit being adjacent to said third word line driving circuit.

24. A semiconductor memory device according to claim 23, wherein each of said first, second, third, and fourth word line driving circuits has a width corresponding to two word lines.

25. A semiconductor memory device according to claim 23, wherein each contact is a self-aligned contact.

26. A semiconductor memory device according to claim 23, wherein said first word line driving circuit includes at least a first transistor for grounding said first word line when said first word line is inactive, said second word line driving circuit includes at least a second transistor for grounding said second word line when said second word line is inactive, said third word line driving circuit includes at least a third transistor for grounding said first word line when said third word line is inactive, and said fourth word line driving circuit includes at least a fourth transistor for grounding said second word line when said fourth word line is inactive.

27. A semiconductor memory device according to claim 26, further comprising:

a first ground line for supplying a ground potential to said first and second transistors; and a second ground line for supplying the ground potential to said third and fourth transistors, said second ground line being arranged at a position where said second ground line faces said first ground line via said memory cell array.

* * * * *

UNITED STATES PATENT AND TRADEMARK OFFICE
CERTIFICATE OF CORRECTION

PATENT NO.: 6,002,636

DATED: December 14, 1999

INVENTOR(S): Kenji TSUCHIDA, *et al.*

It is certified that the error appears in the above-identified patent and that said Letters Patent is hereby corrected as shown below:

In Item [54], in the Title:

Delete "DRIVE" and insert --DEVICE-- therein.

Signed and Sealed this

Twenty-second Day of May, 2001

*Attest:*

NICHOLAS P. GODICI

*Attesting Officer*    *Acting Director of the United States Patent and Trademark Office*